(12) United States Patent
Sutardja

(10) Patent No.: US 7,516,027 B2
(45) Date of Patent: Apr. 7, 2009

(54) CONFIGURABLE VOLTAGE REGULATOR

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 11/546,832

(22) Filed: Oct. 12, 2006

(65) Prior Publication Data

US 2007/0043988 A1 Feb. 22, 2007

Related U.S. Application Data

(60) Continuation of application No. 11/517,932, filed on Sep. 8, 2006, and a continuation-in-part of application No. 11/411,377, filed on Apr. 26, 2006, now Pat. No. 7,209,845, which is a division of application No. 11/220,255, filed on Sep. 6, 2005, now Pat. No. 7,062,392, which is a division of application No. 10/251,372, filed on Sep. 19, 2002, now Pat. No. 6,970,794.

(60) Provisional application No. 60/824,108, filed on Aug. 31, 2006, provisional application No. 60/820,874, filed on Jul. 31, 2006, provisional application No. 60/818,817, filed on Jul. 6, 2006.

(51) Int. Cl.
*G06F 19/00* (2006.01)
(52) U.S. Cl. ............... 702/65; 702/105; 365/186; 365/149; 365/194; 365/189.9
(58) Field of Classification Search ............... 702/65, 702/105; 365/186, 149, 194, 189.9; 324/158, 324/158.1, 416; 327/58, 517, 89, 62, 65, 327/78, 530, 514; 257/411, 646, 649, E21.268, 257/E21.293, E29.003, E29.042
See application file for complete search history.

(56) References Cited

U.S. PATENT DOCUMENTS

| | | | |
|---|---|---|---|
| 3,665,365 A | 5/1972 | Hartman | |
| 3,873,917 A | 3/1975 | Kreuzer | |
| 3,979,613 A | 9/1976 | Kroger et al. | |
| 4,408,157 A | 10/1983 | Beaubien | ............ 324/712 |
| 4,419,619 A | 12/1983 | Jindrick et al. | |
| 4,659,997 A | 4/1987 | Ferland et al. | |
| 4,659,998 A | 4/1987 | Ferland et al. | |
| 4,714,875 A | 12/1987 | Bailey et al. | |

(Continued)

FOREIGN PATENT DOCUMENTS

WO WO 02/054094 A1 7/2002

OTHER PUBLICATIONS

Communication form PCT dated Jan. 24, 2008 transmitting International Search Report for Application No. PCT/US2007/011880; 5 pages.

*Primary Examiner*—Carol S Tsai

(57) ABSTRACT

A production testing system for testing an integrated circuit comprises a control module that generates a setpoint and a setpoint range. A configurable integrated circuit receives the setpoint and the setpoint range, that has M predetermined configurations, and generates N successive output signals by sequentially selecting N ones of M discrete values of an output characteristic of the configurable integrated circuit based on the setpoint and the setpoint range, where M and N are integers greater than one and where M is greater than N. An integrated circuit is tested in accordance with the N output signals of the configurable integrated circuit.

30 Claims, 16 Drawing Sheets

U.S. PATENT DOCUMENTS

| | | | |
|---|---|---|---|
| 4,764,925 A | 8/1988 | Grimes et al. | |
| 4,899,099 A | 2/1990 | Mendenhall et al | |
| 5,194,979 A | 3/1993 | Koai et al. | |
| 5,325,315 A | 6/1994 | Engel et al. | |
| 5,414,364 A | 5/1995 | McCollum | |
| 5,818,247 A | 10/1998 | Pyun | |
| 5,834,975 A | 11/1998 | Bartlett et al | |
| 5,859,541 A | 1/1999 | McMahan et al | |
| 6,101,618 A | 8/2000 | McClure | |
| 6,115,298 A | 9/2000 | Kwon et al | |
| 6,400,160 B1 | 6/2002 | Sampath | |
| 6,424,200 B1 | 7/2002 | McNitt et al | |
| 6,477,080 B2 | 11/2002 | Yamaki et al | |
| 6,477,090 B2 | 11/2002 | Yamaki et al | |
| 6,489,799 B1 | 12/2002 | Murakami | 324/765 |
| 6,496,027 B1 * | 12/2002 | Sher et al. | 324/763 |
| 6,643,193 B2 | 11/2003 | Yamaki et al. | |
| 6,643,472 B1 | 11/2003 | Sakamoto et al. | |
| 6,756,805 B2 * | 6/2004 | Sher et al. | 324/765 |
| 6,819,612 B1 | 11/2004 | Achter | |
| 6,894,501 B1 | 5/2005 | Flasck et al. | 324/416 |
| 6,930,503 B2 * | 8/2005 | Sher et al. | 324/765 |
| 6,944,556 B1 | 9/2005 | Roach | |
| 7,091,770 B2 * | 8/2006 | Schlaffer | 327/541 |
| 7,103,487 B2 | 9/2006 | Roach | |
| 7,193,906 B2 * | 3/2007 | Jang et al. | 365/189.09 |
| 2002/0171448 A1 | 11/2002 | Takeuchi | |
| 2002/0186041 A1 | 12/2002 | Metz et al | |
| 2003/0210917 A1 | 11/2003 | Stewart et al. | |
| 2004/0059528 A1 | 3/2004 | Sutardja | |
| 2004/0201399 A1 * | 10/2004 | Sher et al. | 324/765 |

\* cited by examiner

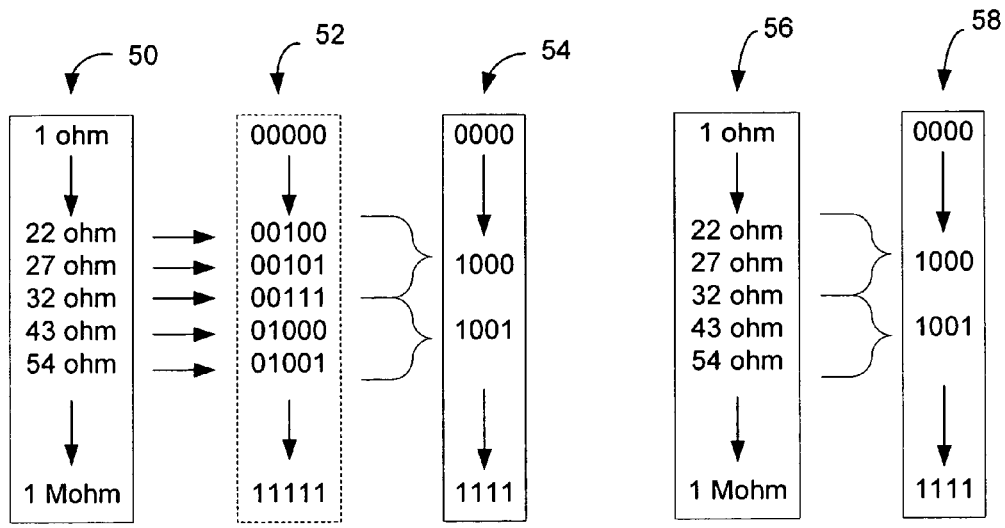
FIG. 3A  FIG. 3B
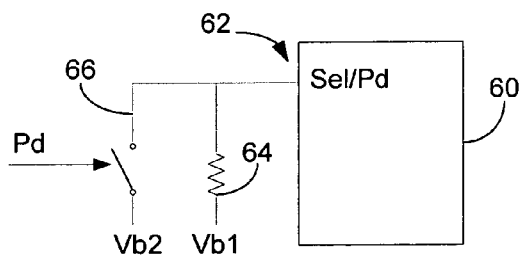
FIG. 4
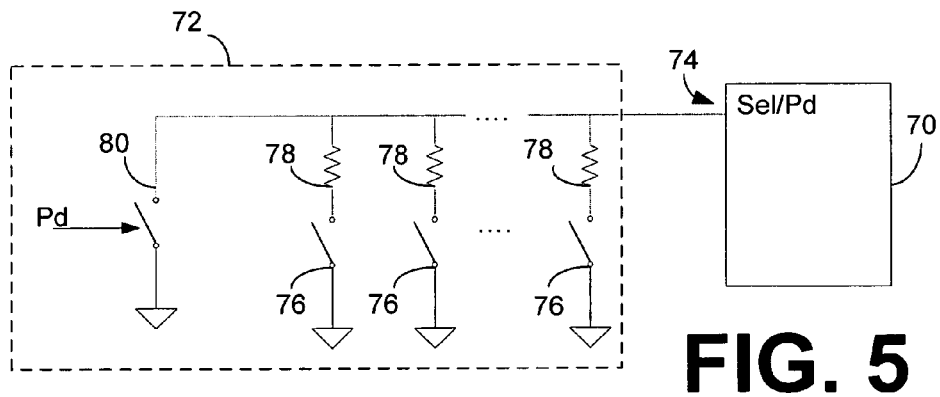
FIG. 5

CONFIGURABLE VOLTAGE REGULATOR

CROSS-REFERENCE TO RELATED APPLICATIONS

This application is a Continuation of U.S. Ser. No. 11/517,932 filed Sep. 8, 2006, which claims the benefit of U.S. Provisional Application Nos. 60/824,108, filed on Aug. 31, 2006, 60/820,874, filed on Jul. 31, 2006, and 60/818,817, filed on Jul. 6, 2006, and is a continuation in part of U.S. patent application Ser. No. 11/411,377, filed on Apr. 26, 2006, which is a divisional of U.S. patent application Ser. No. 11/220,255, filed on Sep. 6, 2005, which is a divisional of application Ser. No. 10/251,372, filed Sep. 19, 2002, the entire contents of which are herein incorporated by reference.

BACKGROUND

Broad classes of semiconductor devices may include several configurations of the same basic device differing in one or more aspects such as output voltage, frequency, trigger temperature, and the like. There are several conventional techniques for providing a specific configuration from a family of devices. In one technique, different versions of the same basic semiconductor are manufactured with slightly different internal component values or configuration to provide the differing outputs. For example, voltage regulators may include a family of devices having various output voltages and tolerance levels. Different devices are manufactured and inventoried by suppliers etc. to provide each of the possible combinations of output voltage and tolerance. An advantage of this approach is that devices with tight tolerances may be provided without the need for expensive external components. However, the cost of the regulators may be higher due to the lower quantities that are produced for each specific voltage/tolerance combination as well as the increased inventory costs.

Another technique uses one or more external components to complete an internal circuit such as an error amplifier for a voltage regulator. Here, the tolerance of the external components has a direct affect on the tolerance of the output that is generated. To attain an output with a tight tolerance, higher priced tight tolerance external components may be required. In addition, a large selection of the tight tolerance external components may be have to be stocked to provide flexibility in setting the output to the desired value.

Shown in FIG. 1A is a third technique for configuring a semiconductor 5. The third technique uses digital input signals to set the semiconductor configuration. Pull-up resistors 6 in combination with switches 7 generate the digital input signals. One digital input may select between two ($2^1$) configurations. Two digital inputs may select between four ($2^2$) configurations. Three digital inputs may select between eight ($2^3$) configurations and so on. To select between a moderate number of configurations, a large quantity of pins may be required. Dedicating four pins merely for selecting between 16 configurations is costly in terms of both, price and package size. Whereas, using two pins for selection may provide reasonable cost and package size, but only provides selection from amongst four configurations.

SUMMARY

A testing system comprises a configurable integrated circuit that selectively communicates with one or more of N external impedances, that has M predetermined configurations that are selected based on an electrical characteristic of the one or more of the N external impedances, where N and M are integers greater than one. The configurable integrated circuit generates a selected one of M discrete values of an output characteristic of the configurable integrated circuit based on the selected one of the M predetermined configurations. An integrated circuit is tested in accordance with an output of the configurable integrated circuit.

In other features, the integrated circuit includes at least one of a memory circuit and a central processing unit. A test module tests operation of the integrated circuit while the integrated circuit operates based upon at least two of the M discrete values of the output characteristic. The test module is integrated with the integrated circuit. The test module is separate from the integrated circuit.

In other features, N switches are associated with N external impedances, respectively. A power supply is connected to the N switches. The configurable integrated circuit includes a measurement circuit that measures the electrical characteristic of the one or more external impedances and that determines a digital value corresponding to the measured electrical characteristic; a storage circuit including memory locations having contents accessible as a function of the digital value, wherein each of the contents corresponds to a respective one of the M predetermined configurations; and a controller that configures the selected one of the M discrete values of the output characteristic of the configurable integrated circuit based on the contents of the memory locations corresponding to the digital value.

In other features, a value determiner determines the digital value corresponding to the measured electrical characteristic. An address generator converts the digital value to a first digital address corresponding to one of the memory locations. The at least one external impedance is selected from a group consisting of a resistor, a capacitor, and combinations thereof. At least one of P configurable integrated circuits communicates with the configurable integrated circuit. P additional circuits communicate with respective ones of the P additional configurable integrated circuits, wherein P is an integer greater than zero. The P configurable integrated circuits are connected in a daisy-chain configuration. A selection module selectively connects one or more of the N external impedances to the configurable integrated circuit. The configurable integrated circuit is a power management interface circuit.

A method comprises configuring a configurable integrated circuit using one or more of N external impedances; selecting one of M predetermined configurations based on an electrical characteristic of the one or more of the N external impedances, where N and M are integers greater than one; generating a selected one of M discrete values of an output characteristic of the configurable integrated circuit based on the selected one of the M predetermined configurations; and testing an integrated circuit in accordance with an output of the configurable integrated circuit.

In other features, the integrated circuit includes at least one of a memory circuit and a central processing unit. The method includes testing operation of the integrated circuit while the integrated circuit operates based upon at least two of the M discrete values of the output characteristic. The method includes performing the testing operation using a test module that is integrated with the integrated circuit. The method includes performing the testing operation using a test module that is separate from the integrated circuit. The method includes providing N switches, each associated with one of the N external impedances. The method includes providing a power supply that is connected to the N switches.

In other features, the method includes measuring the electrical characteristic of the one or more external impedances;

determining a digital value corresponding to the measured electrical characteristic; providing a storage circuit including memory locations having contents accessible as a function of the digital value, wherein each of the contents corresponds to a respective one of the M predetermined configurations; and configuring the selected one of the M discrete values of the output characteristic of the configurable integrated circuit based on the contents of the memory locations corresponding to the digital value.

In other features, the one or more of N external impedances are selected from a group consisting of a resistor, a capacitor, and combinations thereof. The method includes providing P configurable integrated circuits, wherein at least one of the P configurable integrated circuits communicate with the configurable integrated circuit; and providing P additional circuits that communicate with respective ones of the P additional configurable integrated circuits, wherein P is an integer greater than zero.

In other features, the method includes connecting the P configurable integrated circuits in a daisy-chain configuration.

A testing system comprises configurable integrated circuit means for selectively communicating with one or more of N external impedance means for providing impedance. The configurable integrated circuit means has M predetermined configurations that are selected based on an electrical characteristic of the one or more of the N external impedance means, where N and M are integers greater than one. The configurable integrated circuit means generates a selected one of M discrete values of an output characteristic of the configurable integrated circuit means based on the selected one of the M predetermined configurations. The integrated circuit means is tested in accordance with an output of the configurable integrated circuit means.

In other features, the integrated circuit means includes at least one of storing means for storing data and processing means for processing data. Testing means tests operation of the integrated circuit means while the integrated circuit means operates based upon at least two of the M discrete values of the output characteristic. The testing means is integrated with the integrated circuit means. The testing means is separate from the integrated circuit means.

In other features, N switching means for switching are associated with the N external impedance means, respectively. Power means for supplying power communicates with the N switching means.

In other feature, the configurable integrated circuit means includes: measurement means for measuring the electrical characteristic of the one or more external impedances and for determining a digital value corresponding to the measured electrical characteristic; storage means for storing including memory locations having contents accessible as a function of the digital value, wherein each of the contents corresponds to a respective one of the M predetermined configurations; and control means for configuring the selected one of the M discrete values of the output characteristic of the configurable integrated circuit means based on the contents of the memory locations corresponding to the digital value.

In other features, value determining means determines the digital value corresponding to the measured electrical characteristic; and address generating means for converting the digital value to a first digital address corresponding to one of the memory locations. The one or more N external impedance means are selected from a group consisting of a resistor, a capacitor, and combinations thereof. P configurable integrated circuit means provide M predetermined configurations, wherein at least one of the P configurable integrated circuit means is configured by the configurable integrated circuit means. P integrated circuit means are tested and communicate with respective ones of the P additional configurable integrated circuit means, wherein P is an integer greater than zero. The P configurable integrated circuit means are connected in a daisy-chain configuration. Selection means for selectively connecting one or more of the N external impedance means to the configurable integrated circuit means. The configurable integrated circuit means is a power management interface circuit.

A testing system comprises a configurable integrated circuit that has M predetermined configurations that are selected based upon an input signal. The configurable integrated circuit generates a selected one of M discrete values of an output characteristic of the configurable integrated circuit based on the selected one of the M predetermined configurations, where M is an integer greater than one. An integrated circuit is tested in accordance with an output of the configurable integrated circuit.

In other features, the integrated circuit includes at least one of a memory circuit and a central processing unit. A test module tests operation of the integrated circuit while the integrated circuit operates based upon at least two of the M discrete values of the output characteristic. The test module is integrated with the integrated circuit. The test module communicates with the integrated circuit. A selector control module generates the input signal. The input signal includes a signal that selectively increases the selected one of the M discrete values of the external characteristic and decreases the selected one of the M discrete values of the external characteristic.

In other features, P additional configurable integrated circuits communicate with the configurable integrated circuit in a daisy chain configuration. P additional circuits communicate with a respective one of the P additional configurable integrated circuits.

A method for testing comprises providing a configurable integrated circuit that has M predetermined configurations; selecting one of the M predetermined configurations based upon an input signal; generating a selected one of M discrete values of an output characteristic of the configurable integrated circuit based on the selected one of the M predetermined configurations, where M is an integer greater than one; and testing an integrated circuit in accordance with an output of the configurable integrated circuit.

In other features, the integrated circuit includes at least one of a memory circuit and a central processing unit. The method further comprises testing operation of the integrated circuit while the integrated circuit operates based upon at least two of the M discrete values of the output characteristic. The method further comprises integrating the test module integrated with the integrated circuit. The method further comprises generating the input signal, wherein the input signal includes a signal that selectively increases the selected one of the M discrete values of the external characteristic and decreases the selected one of the M discrete values of the external characteristic.

In other features, the method further comprises providing P additional configurable integrated circuits that communicate with the configurable integrated circuit in a daisy chain configuration; and providing P additional circuits that communicate with a respective one of the P additional configurable integrated circuits.

A testing system comprises configurable integrated circuit means for providing M predetermined configurations that are selected based upon an input signal. The configurable integrated circuit means generates a selected one of M discrete values of an output characteristic of the configurable integrated circuit means based on the selected one of the M predetermined configurations, where M is an integer greater than one. Integrated circuit means is tested in accordance with an output of the configurable integrated circuit means.

In other features, the integrated circuit means includes at least one of storing means for storing data and processing means for processing data. Test means tests operation of the integrated circuit means while the integrated circuit means operates based upon at least two of the M discrete values of the output characteristic. The test means is integrated with the integrated circuit means. The test means communicates with the integrated circuit means. Selector control means generates the input signal. The input signal includes a signal that selectively increases the selected one of the M discrete values of the external characteristic and decreases the selected one of the M discrete values of the external characteristic. P additional configurable integrated circuit means communicate with the configurable integrated circuit means in a daisy chain configuration. P additional circuit means communicate with a respective one of the P additional configurable integrated circuit means.

A production testing system for testing an integrated circuit comprises a control module that generates a setpoint and a setpoint range. A configurable integrated circuit receives the setpoint and the setpoint range, has M predetermined configurations, and generates N successive output signals by sequentially selecting N ones of M discrete values of an output characteristic of the configurable integrated circuit based on the setpoint and the setpoint range, where M and N are integers greater than one and where M is greater than N. An integrated circuit is tested in accordance with the N output signals of the configurable integrated circuit.

In other features, the setpoint is a voltage setpoint, the setpoint range is a voltage setpoint range and the N output signals are N voltage output signals. The integrated circuit includes at least one of a memory circuit and a central processing unit. A test module tests operation of the integrated circuit while the integrated circuit operates based on the N output signals of the configurable integrated circuit. The test module is integrated with at least one of the control module, the configurable integrated circuit and the integrated circuit. The test module communicates with one of the integrated circuit and the configurable integrated circuit.

In other features, a clock generates a plurality of clock frequencies for the integrated circuit. The integrated circuit is tested at a first clock speed, a first setpoint and a first setpoint range and a second clock speed that is different that the first clock speed, a second setpoint that is different than the first setpoint and a second setpoint range. The first setpoint range is different that the second setpoint range. The setpoint range includes a fixed offset from the setpoint. The setpoint range includes a percentage offset from the setpoint.

A method for production testing an integrated circuit comprises generating a setpoint and a setpoint range using a control module; providing a configurable integrated circuit that receives the setpoint and the setpoint range, that has M predetermined configurations, and that generates N successive output signals by sequentially selecting N ones of M discrete values of an output characteristic of the configurable integrated circuit based on the setpoint and the setpoint range, where M and N are integers greater than one and where M is greater than N; and testing an integrated circuit in accordance with the N output signals of the configurable integrated circuit.

In other features, the setpoint is a voltage setpoint, the setpoint range is a voltage setpoint range and the N output signals are N voltage output signals. The integrated circuit includes at least one of a memory circuit and a central processing unit. The method includes testing operation of the integrated circuit while the integrated circuit operates based on the N output signals of the configurable integrated circuit. The method includes performing the testing using a test module that is integrated with at least one of the control module, the configurable integrated circuit and the integrated circuit. The method includes performing the testing using a test module that communicates with one of the integrated circuit and the configurable integrated circuit. The method includes generating a plurality of clock frequencies for the integrated circuit. The method includes testing the integrated circuit at a first clock speed, a first setpoint and a first setpoint range; and testing the integrated circuit at a second clock speed that is different that the first clock speed, a second setpoint that is different than the first setpoint and a second setpoint range.

In other features, the first setpoint range is different that the second setpoint range. The setpoint range includes a fixed offset from the setpoint. The setpoint range includes a percentage offset from the setpoint.

A production testing system for testing an integrated circuit comprises control means for generating a setpoint and a setpoint range; a configurable integrated circuit that receives the setpoint and the setpoint range, that has M predetermined configurations, and that generates N successive output signals by sequentially selecting N ones of M discrete values of an output characteristic of the configurable integrated circuit based on the setpoint and the setpoint range, where M and N are integers greater than one and where M is greater than N; and an integrated circuit that is tested in accordance with the N output signals of the configurable integrated circuit.

In other features, the setpoint is a voltage setpoint, the setpoint range is a voltage setpoint range and the N output signals are N voltage output signals. The integrated circuit includes at least one of a memory circuit and a central processing unit. Test means tests operation of the integrated circuit while the integrated circuit operates based on the N output signals of the configurable integrated circuit. The test means is integrated with at least one of the control means, the configurable integrated circuit and the integrated circuit. The test means communicates with one of the integrated circuit and the configurable integrated circuit. Clock means generates a plurality of clock frequencies for the integrated circuit. The integrated circuit is tested at a first clock speed, a first setpoint and a first setpoint range and a second clock speed that is different that the first clock speed, a second setpoint that is different than the first setpoint and a second setpoint range. The first setpoint range is different that the second setpoint range. The setpoint range includes a fixed offset from the setpoint. The setpoint range includes a percentage offset from the setpoint.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 3A and 3B are diagrams showing a relationship between an external impedance value and a digital value.

FIG. 4 is a schematic diagram of a configurable semiconductor having a multifunction pin.

FIG. 5 is a schematic diagram of a multifunction pin with programmable control.

Like reference symbols in the various drawings indicate like elements.

DETAILED DESCRIPTION

Figure 1A:
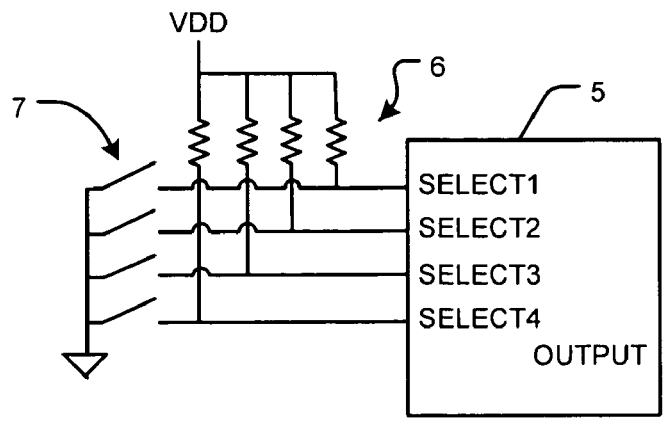
FIG. 1A is a block diagram of a selection circuit connected to a conventional configurable semiconductor.
Figure 1B:
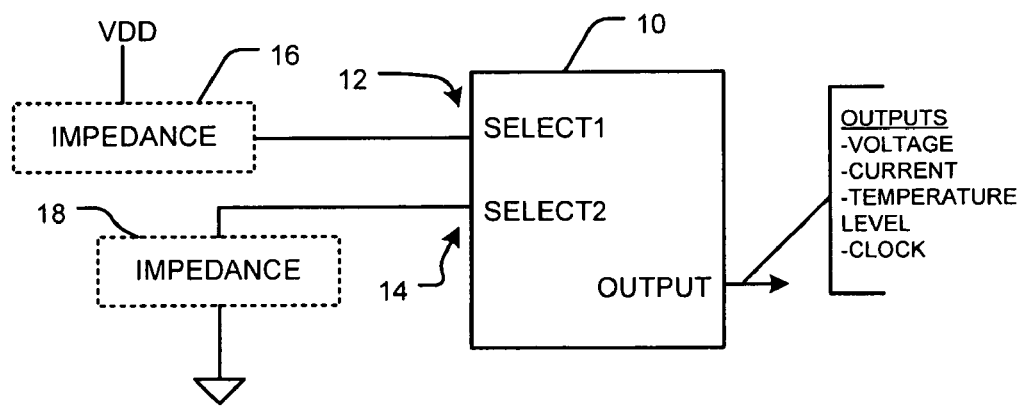
FIG. 1B is a block diagram of a configurable semiconductor connected to external impedances.

FIG. 1B shows a configurable semiconductor device 10 having, for example, two select pins 12 and 14 to connect to two external impedances 16 and 18. The configurable semiconductor device 10 advantageously uses a reduced number of select pins for interfacing to external components, as compared to conventional devices, to select one or more output and internal characteristics. One or more pins may be used to interface to the external component(s). The configurable semiconductor device probes or derives information from the external components connected to the select pins. The derived information has three or more predetermined level ranges that correspond to selected levels of the device characteristics. For example, a single pin connected to an external resistor may be used to select any one of 16 output voltage levels. The resistance of the external resistor is preferably selected to be one of 16 predetermined standard values. Each of the 16 values of resistance corresponds to one of the 16 output voltage levels. In addition, low precision passive components are preferably used as the external components to reduce cost and inventory. Each external component may have multiple, N, predetermined nominal values that each correspond to the selection of a predetermined characteristic level. If one pin is used, then N different characteristic levels may be selected. If two pins are used, then N*N different characteristic levels may be selected, and so forth for an increasing number of selection pins. The types of device characteristics that for example may be selected include output voltage, reference voltage, output current, reference current, clock frequency, temperature threshold, and tolerances of each of the device characteristics. For example, the configurable semiconductor device 10 may have a single select pin 12 connected to an external resistor that may have a nominal value selected from a group of 16 predetermined values. Each of the 16 predetermined values has a measured value range which corresponds to one of 16 predetermined output voltage levels possibly ranging from 3.3 volts to 15 volts. Examples of functional devices for which the configurable semiconductor device is particularly suitable include and are not limited to voltage regulators, current regulators, clock circuits, and temperature sensing circuits.

The external impedances 16 and 18 are preferably resistors, capacitors, or combinations of resistors and capacitors, but may be any component that exhibits predominantly an inductance, resistance, capacitance, or combination thereof. The external impedances 16 and 18 may be connected directly or indirectly from any energy source such as Vdd and ground or any suitable reference to the configurable semiconductor device pins 12 and 14. For example, the external impedance 16 may be connected through a resistor/transistor network to Vdd and through a capacitor network to the select pin 12.

The configurable semiconductor device 10 may determine a predetermined select value corresponding to the measured value of the impedance connected to a select pin. Preferably, the impedance is selected to have a standard value such as nominal resistance values corresponding to resistors having a 10% tolerance (e.g. 470, 560, 680, . . . ) to reduce device and inventory costs. To account for measurement tolerances and the tolerance of the external impedance, a range of impedance values may correspond to a single select value. The select value is preferably a digital value, but may also be an analog value. For example, values of measured resistance from 2400 ohms to 3000 ohms may be associated with a digital value corresponding to 2. While values of measured resistance from 3001 ohms to 4700 ohms are associated with a digital value corresponding to 3. The measured resistance includes variations due to tolerances of the external impedance and the internal measurement circuit. The impedance measured at each select pin is used to determine a corresponding digital value. The range of digital values may include 3 or more digital values and preferably range from 10 to 16 digital values per select pin. The digital values corresponding to each select pin may be used in combination to describe memory addresses. For example, a device having three select pins each to interface to impedance values that are mapped into one of 10 digital values, may describe 1000 memory addresses or lookup table values. The contents of the memory addresses are used to set a value for an output or internal characteristic of the device. Another exemplary device may include two select pins, each configured to interface to external impedances that are mapped to a digital value within a range of 10 values. The digital values in combination may describe 100 memory addresses or lookup table values that may each contain data for setting a characteristic of the configurable semiconductor device.

Figure 2:
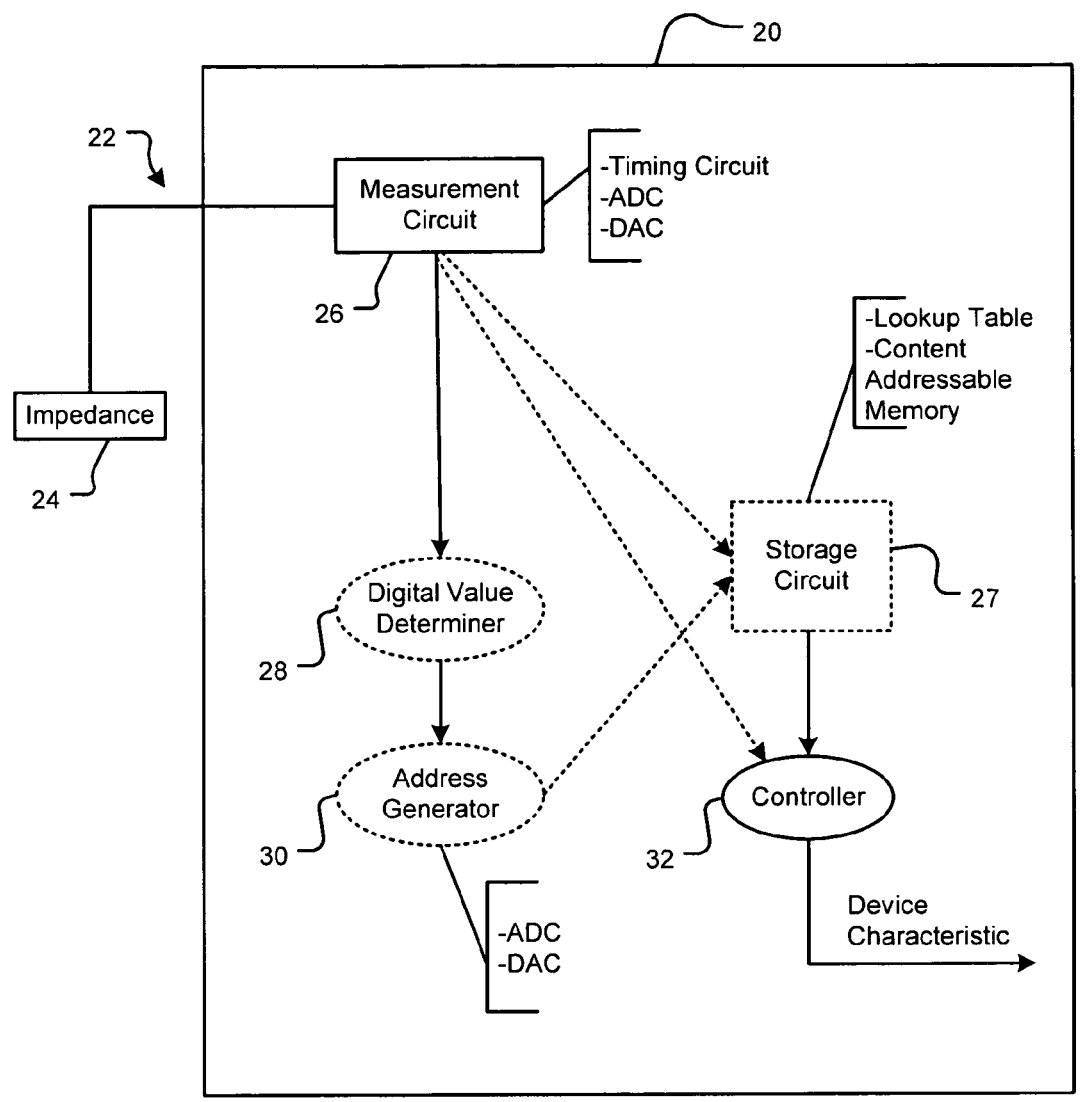
FIG. 2 is a detailed block diagram of a configurable semiconductor connected to external impedances.

FIG. 2 shows a block diagram of an aspect of a configurable semiconductor device 20. The configurable semiconductor device 20 includes a select pin 22 to interface to an external impedance 24 that is used for selecting a configuration of the configurable semiconductor device 20. The external impedance 24 is similar in function and scope to the external impedances 16 and 18.

A measurement circuit 26 connected to the select pin 22 measures an electrical characteristic that is a function of the external impedance 24. For example, a current may be supplied to the external impedance and the voltage that is developed across the external impedance 24 then measured. Also, a voltage may be impressed across the external impedance 24 and then measure the current. Any measurement technique for measuring passive components may be used to measure the electrical characteristic including dynamic as well as static techniques. Exemplary measurement techniques include timing circuits, analog to digital converters (ADCs), and digital to analog converters (DACs). Preferably, the measurement circuit has a high dynamic range. The measurement circuit 26 may generate an output having a value corresponding to the value of the external impedance 24. The output may be either digital or analog. The same output value preferably represents a range of external impedance values to compensate for value variations such as tolerances in the external impedance value, interconnect losses, and measurement circuit tolerances due to factors including process, temperature, and power. For example, all measured external impedance values ranging from greater than 22 up to 32 ohms may correlate to a digital output value of "0100". While measured external impedance values ranging from greater than 32 up to 54 ohms may correlate to a digital output value of "0101". The actual external impedance values are a subset of the measured external impedance value to account for the value variations. For example, in the above cases the actual external impedance values might be from 24 to 30 ohms and from 36 to 50 ohms. In each case an inexpensive low precision resistor may be selected to have a value centered within the range, such as 27 ohms and 43 ohms. In this way, inexpensive low precision components may be used to select amongst a range of high precision outputs. The select value may be used directly as a variable value to control a device characteristic of the configurable semiconductor 20. The variable value may also be determined indirectly from the select value.

A storage circuit 27 may include variable values that may be selected as a function of the select value. The storage circuit may be any type of storage structure including content addressable memory, static and dynamic memory, and lookup tables.

For the case that the measurement circuit 26 generates output values that have a one-to-one correspondence to the external impedance values, a digital value determiner 28 may then set the output value to a select value that corresponds to a range of external impedance values.

FIG. 3A shows a relationship between groups of impedance values 50 and associated select values 54. The groups of impedance values 50 may have a one-to-one correspondence to groups of digital output values 52 which are converted to the select values 54 associated with each of the groups of impedance values 50. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. The spacing between the groups of impedance values is preferably based on geometric progression, however any mathematical relationship may be used to establish spacing between the groups such as logarithmic, linear, and exponential. The spacing between impedance groups may be based on any impedance value of the groups including a nominal value, an average value, a mean value, a starting value, and an ending value. Factors that influence selection of the impedance range of the groups and the spacing may include various tolerances such as the tolerance of the external impedance, the tolerance of internal voltage and current sources, and the tolerance of the measurement circuit. The tolerances may for example be caused by process, temperature, and power variations.

FIG. 3B shows a relationship between ranges of impedance values 56 and associated select values 58. The ranges of impedance values 56 have a direct correspondence to the select values 58. The impedance values ranging from a minimum impedance value to a maximum impedance are separated in into three or more groups, with each group having a nominal impedance. The nominal impedance values of each of the groups may be selected to have a spacing between nominal impedance values. Here, the nominal values, 27 ohms and 43 ohms, of the groups of impedance values have a spacing of 16 ohms. This direct correspondence between the ranges of impedance values 56 and associated select values 58 may be implemented by, for example, a nonlinear analog to digital converter (not shown).

Referring back to FIG. 2, an address generator 30 may determine memory locations corresponding to the digital output values associated with external impedances connected to the select pins. The memory locations may be grouped in any manner such as a list for a single select pin, a lookup table for two select pins, and a third order table for three select pins.

A controller 32 sets a device characteristic of the configurable semiconductor device 20 as a function of the variable value. The variable value may be generated directly by the measurement circuit, determined indirectly from the select value, and determined from the contents of a memory location corresponding to the external impedance values connected to the select pins.

FIG. 4 shows an aspect of another configurable semiconductor device 60. Configurable semiconductor device 60 is similar to configurable semiconductor device 20 in function, except that configurable semiconductor device 60 includes at least one multi-purpose select pin 62. The multi-purpose select pin 62 may be used for configuring the semiconductor device 60 as well as for an additional function such as power down (PD), power enable, mode selection, reset, and synchronous operation. The semiconductor device 60 may be configured in a manner similar to that of configurable semiconductor device 20.

In one aspect, a first range of impedance values connected to the multi-purpose select pin 62 may be used to configure the configurable semiconductor device 60, while operation of the additional function may be controlled by a voltage or current impressed on the multi-purpose select pin, or impedance values outside the first range of impedance values.

An external impedance 64 and a switch 66 may be connected to the multi-purpose select pin 62 to provide the selection function and the additional function respectively. Bias voltages, Vb1 and Vb2, may be applied to the external impedance 64 and transistor 66. The bias voltages, Vb1 and Vb2, may each be any value ranging from negative voltage through ground to positive voltage, and equal or not equal. The switch 66 may be connected in any manner including from the multi-purpose select pin 62 to ground, from the multi-purpose select pin 62 to a voltage source, from the multi-purpose select pin 62 to a current source, and from the multi-purpose select pin 62 through another impedance to an energy source. Any type of switch or device configured as a switch may be used including transistors, analog switches, jumper wires/traces, and manual switches.

FIG. 5 shows a configurable semiconductor device 70 coupled to a digital control circuit 72. The digital control circuit 72 may be connected in any manner such as a stand-alone circuit and included in another device such as a processor. The configurable semiconductor device may include a multi-purpose select pin 74 similar in function to configurable semiconductor device 60. The digital control circuit 72 may include several switches 76 to control external impedances 78 for setting an impedance on the multi-purpose select pin 74. Any number and type of switches 76 may be employed including transistors, analog switches, jumper wires/traces, and manual switches. Preferably, the external impedances 78 are selected to have standard values although any range of values may be used. Another transistor 80 may control operation of additional functions.

Figure 6:
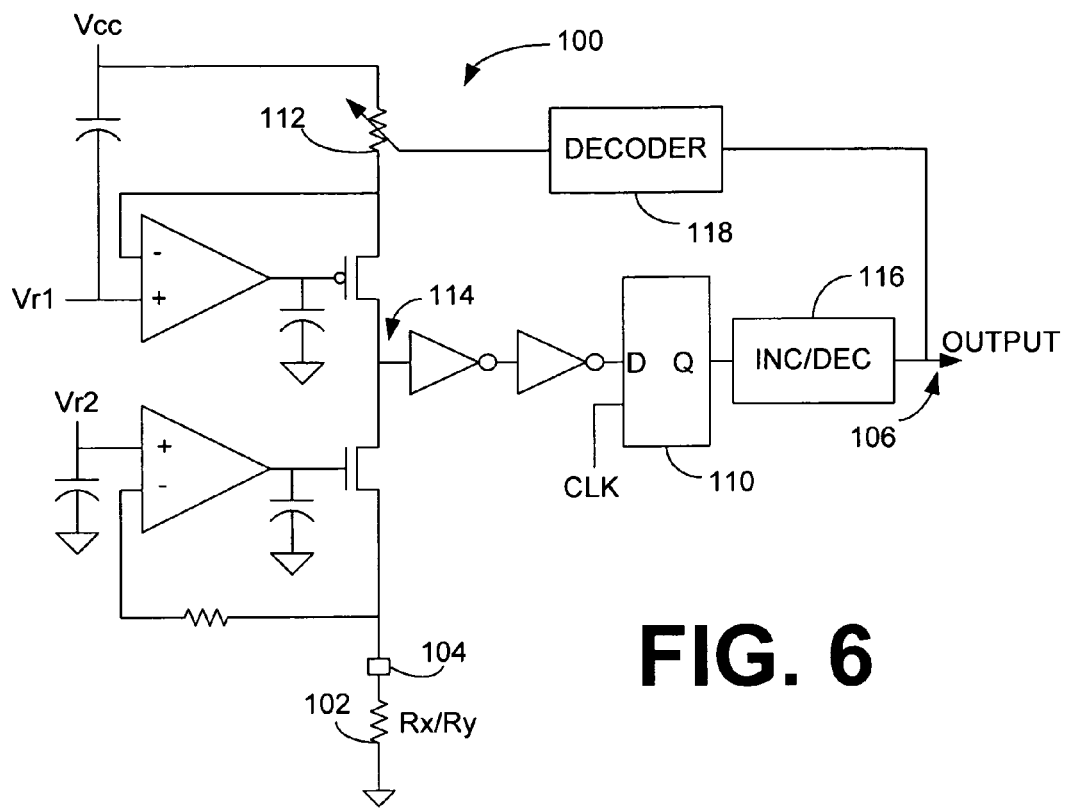
FIG. 6 is a schematic diagram of a timing circuit for generating a digital value.

FIG. 6 shows one embodiment of a measurement circuit 100 for determining a digital output 106 corresponding to an external impedance 102. The external impedance 102 may be connected to the measurement circuit 100 through a select pin 104. Table I shows exemplary values for the external impedance 102 and corresponding values of the digital output. Predefined operation #2 may enable the power down function. The impedance at the select pin that corresponds to predefined operations #1 or #2 may be intentional or unintentional such as a selected resistor, a cold solder joint, a broken trace, shorted traces, or a failed external device.

TABLE I

| # | Rx/Ry | Vout | Vout % | Digital Output |
|---|---|---|---|---|
| 0 | Short to Vss up to 10k | 0 | 0 | Predefined operation #1 |
| 1 | 19.6k | 0.8 | −2 | 000 |
| 2 | 28.5k | 1.0 | −4 | 001 |
| 3 | 40k | 1.2 | −6 | 010 |
| 4 | 56k | 1.5 | −8 | 011 |
| 5 | 80.6k | 1.8 | +2 | 100 |
| 6 | 113k | 2.5 | +4 | 101 |
| 7 | 160k | 3.0 | +6 | 110 |
| 8 | 226k | 3.3 | +8 | 111 |
| 9 | 400k to an open | | | Predefined operation #2 |

Figure 7:
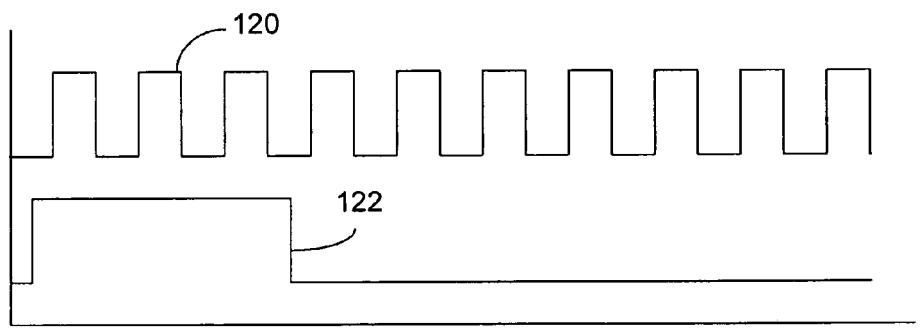
FIG. 7 shows waveforms associated with the timing circuit of FIG. 6.

FIG. 7 shows a timing diagram associated with the measurement circuit 100. A first waveform 120 represents a clock signal 120 to the D flip-flop 110. A second waveform 122 represents an input signal to the D input of the flip-flop 110. In operation, a controlled resistor 112 is initially set to a predetermined value. A first voltage is developed at a first node 114 as a function of the controlled resistor 112 and the external impedance 102. The first voltage is clocked through the flip-flop 110 by the clock signal 120. An incrementer/decrementer 116 may convert the output of the flip-flop 110 to the digital output 106. In response to the digital output 106, a decoder 118 adjusts the controlled resistor 112 to decrease the first voltage. The counter continues to increment until the first voltage decreases to a level equivalent to a logic "0".

Figure 8:
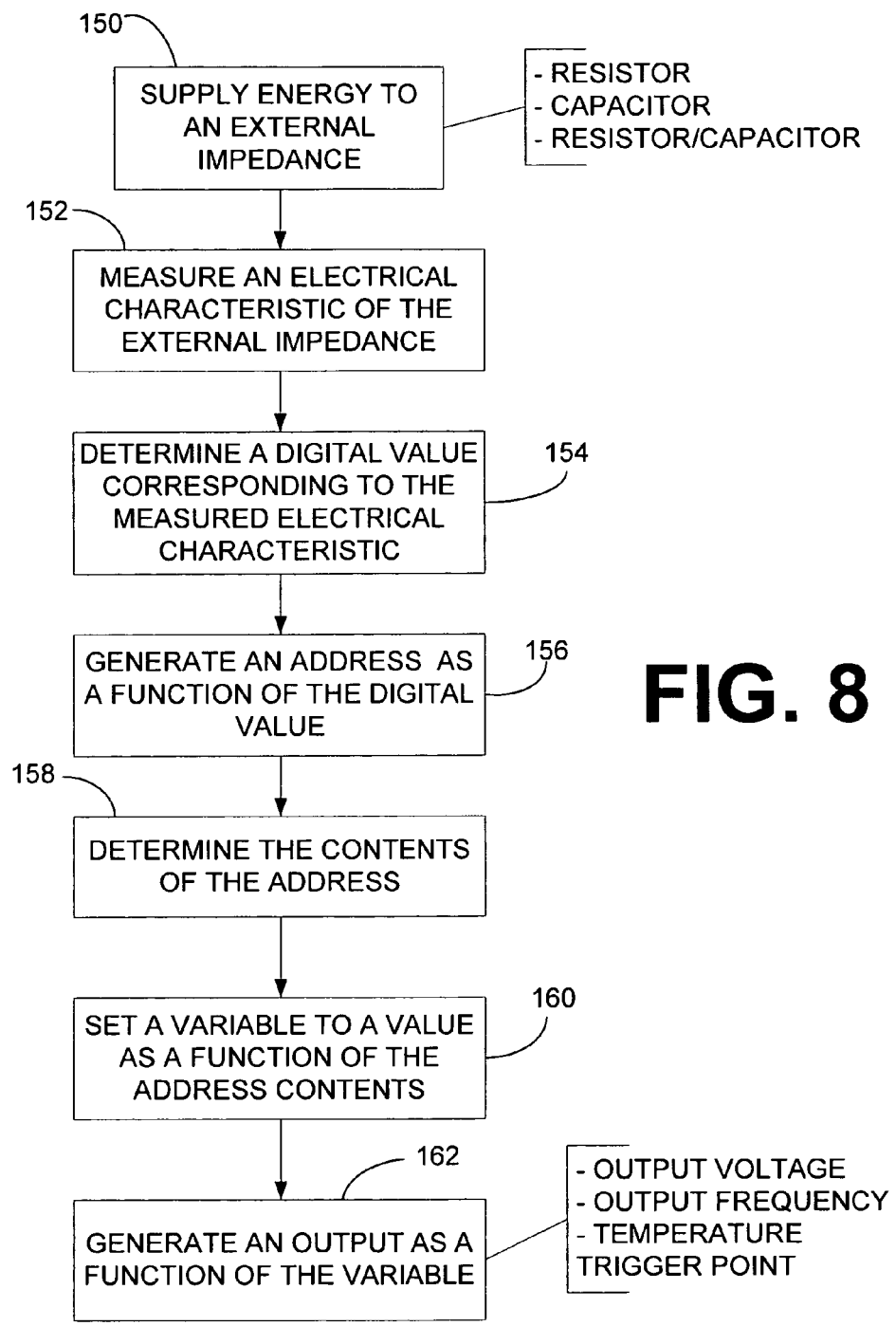
FIG. 8 is a flow diagram of an operation for configuring a semiconductor.

FIG. 8 shows an operation of a configurable semiconductor device. Starting at block 150, energy is supplied to an external impedance. Continuing to block 152, an electrical characteristic that is a function of the external impedance is measured. Electrical characteristics such as a voltage at the select pin and a current flowing through the select pin may be measured.

At block 154, a select value corresponding to the measured electrical characteristic is determined. Continuing to block 156, an address may be generated as a function of the digital value. At block 158, the contents of the address are determined. At block 160, a variable may be controlled as a function of the select value such as directly and based on the address contents. At block 162, a device characteristic such as an output voltage may be controlled as a function of the variable.

Figure 9:
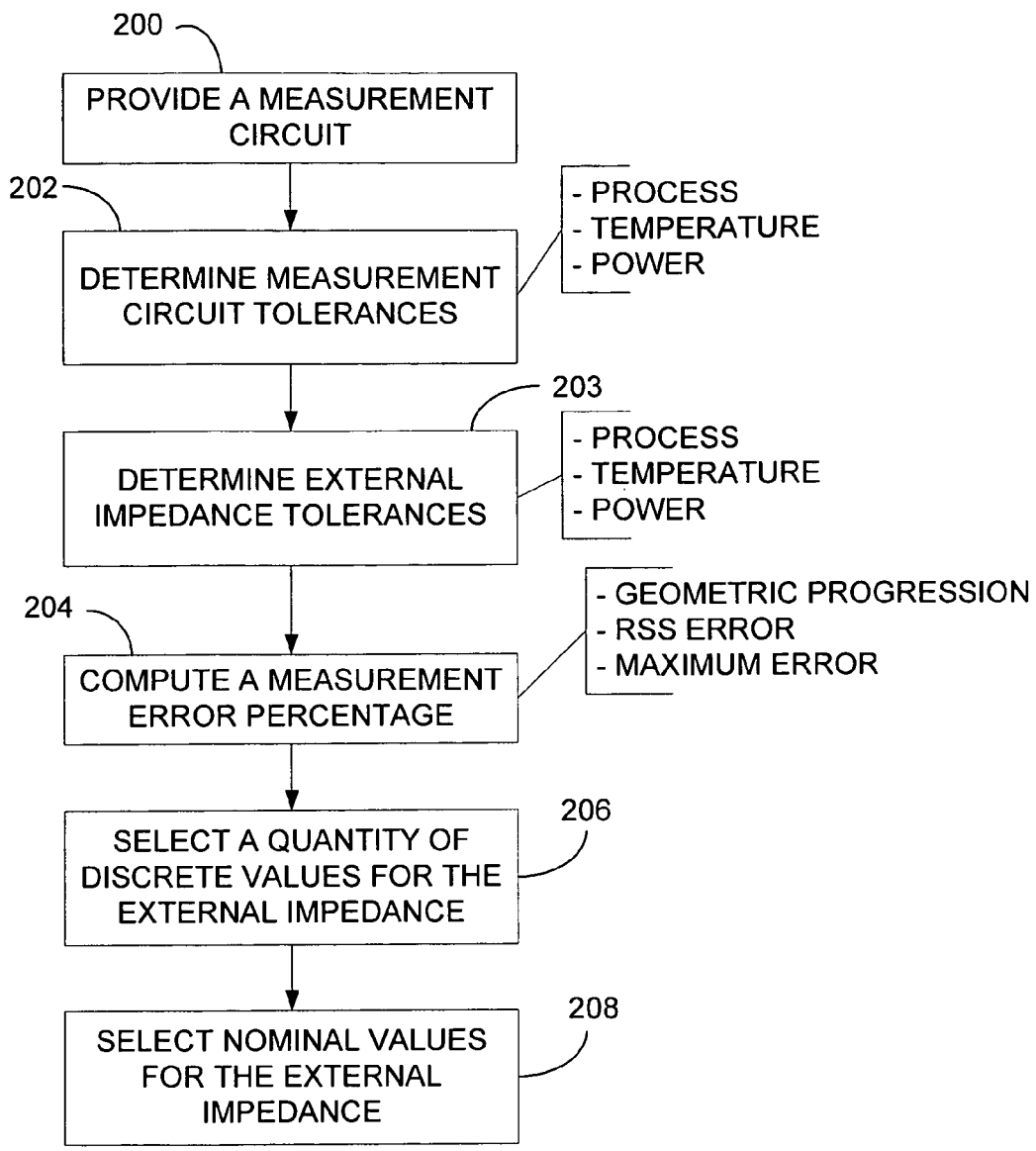
FIG. 9 is a flow diagram of an operation for selecting values for external impedances for configuring a semiconductor.

FIG. 9 shows an operation for selecting the spacing of external impedances used for configuring a semiconductor device. The spacing is preferably selected to permit the use of low precision components by varying the spacing from lower values to higher values to account for potential variations associated with the measurement circuit. Starting at block 200, a measurement circuit is provided. Continuing to blocks 202 and 203, tolerances associated with the measurement circuit and the external impedances may be determined. The tolerances may include variations due to process, temperature, and power. At block 204, a measurement error such as a geometric progression, a maximum error, and root of the sum of the squares (RSS) error may be computed. Continuing to block 206, a quantity of discrete values for the external impedance may be determined. For example, the measurement error may be applied across a voltage range of the measurement circuit to determine the maximum number of discrete values that may be selected. The quantity of discrete values may be any integer value greater than one. At block 208, nominal values are selected for the external impedance as a function of the computed error and the selected quantity of discrete values. The described operation is not limited to the described order of operation. Other ones of the variables may be solved for such as solving for the tolerance of the external impedance after selecting a desired quantity of discrete values.

Figure 10A:
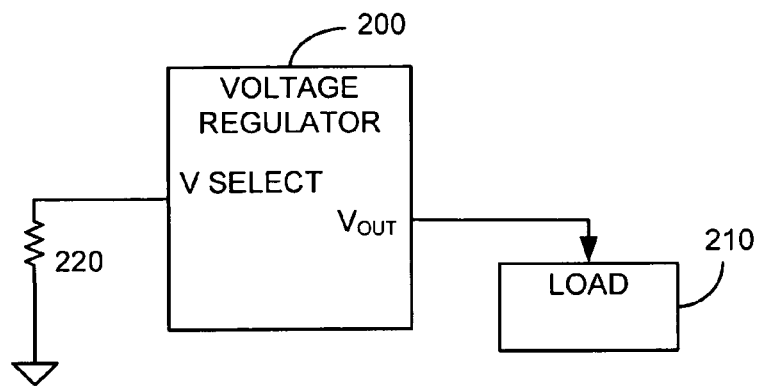
FIG. 10A is a block diagram of a voltage regulator connected to an external impedance.

FIG. 10A is an example of a voltage regulator in accordance with the present invention. Referring now to FIG. 10A a voltage regulator 200 is shown therein providing Vout to load 210, an external impedance 220 is used to select Vout. Table II shows exemplary values for the external impedance 220 and corresponding values of Vout. Predefined operation #2 may enable the power down function or low voltage to protect for an overvoltage condition presented to load 210. The impedance at the select pin that corresponds to predefined operations #1 or #2 may be intentional or unintentional such as a selected resistor, a cold solder joint, a broken trace, shorted traces, or a failed external device.

TABLE II

| # | Impedance 220 | Vout |
|---|---|---|
| 0 | Short to Vss up to 10k | 0 or power down |
| 1 | 19.6k | 0.8 |
| 2 | 28.5k | 1.0 |
| 3 | 40k | 1.2 |
| 4 | 56k | 1.5 |
| 5 | 80.6k | 1.8 |
| 6 | 113k | 2.5 |
| 7 | 160k | 3.0 |
| 8 | 226k | 3.3 |
| 9 | 400k to an open | 0 or low voltage |

Figure 10B:
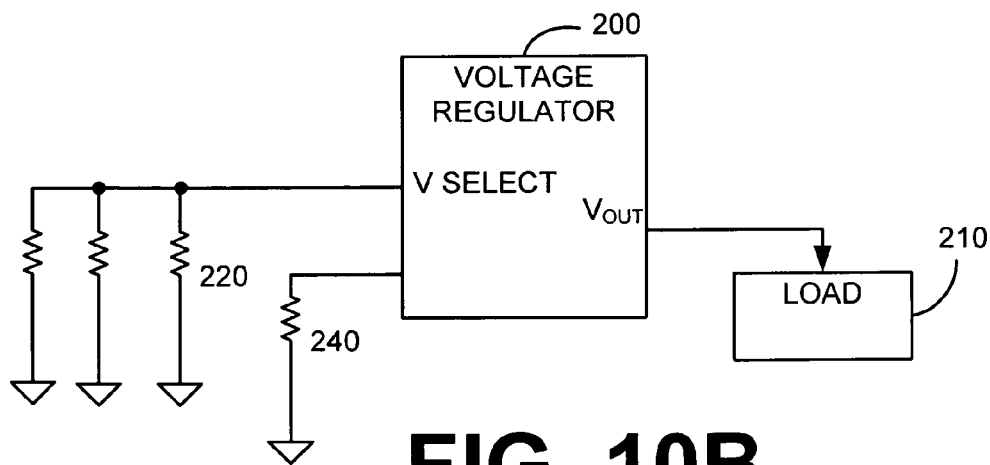
FIG. 10B is a block diagram of a voltage regulator connected to two external impedances.

FIG. 10B is an example of a voltage regulator in accordance with the present invention. Referring now to FIG. 10B a voltage regulator 200 is shown therein providing Vout to load 210, an external impedance 220 is used to select a nominal Vout and impedance 240 is used to select the offset from the nominal Vout. This provides for a significant number of additional output voltages. Table III shows exemplary values for the external impedance 220 and corresponding values of the offset percentages. If impedance 240 is a large value or perhaps an open circuit no offset will be applied to the nominal Vout. While if impedance 240 is a short or very low a predefined operation, such as discussed above, is implemented.

TABLE III

| # | Impedance 240 | Offset % |
|---|---|---|
| 0 | Short to Vss up to 10k | Predefined operation |
| 1 | 19.6k | −2 |
| 2 | 28.5k | −4 |
| 3 | 40k | −6 |
| 4 | 56k | −8 |
| 5 | 80.6k | +2 |
| 6 | 113k | +4 |
| 7 | 160k | +6 |
| 8 | 226k | +8 |
| 9 | 400k to an open | No Offset |

Figure 11A:
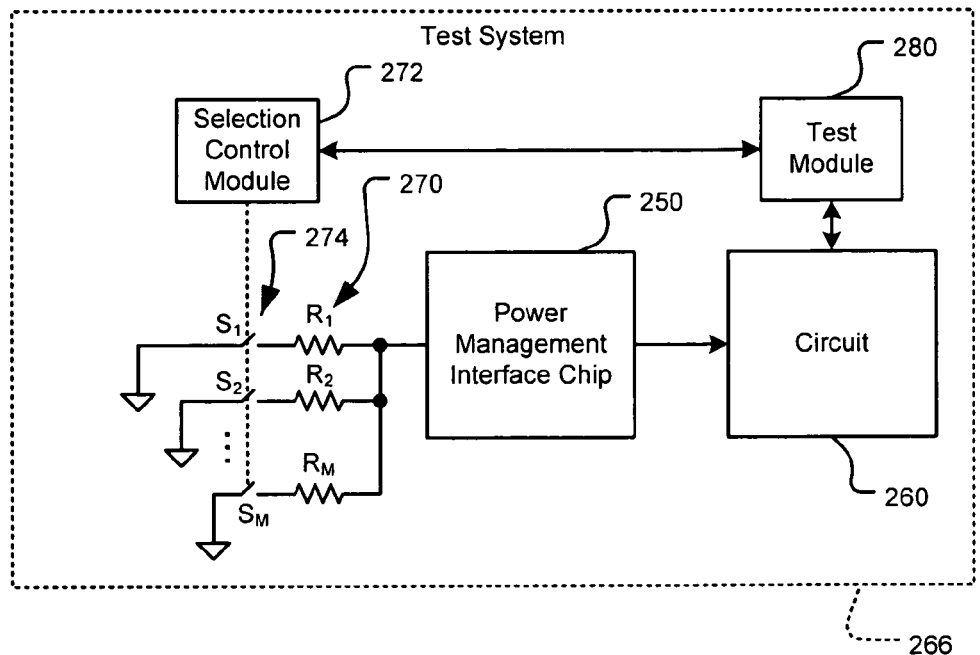
FIGS. 11A-11C are functional block diagrams of a power management interface chip (PMIC) that is externally configured by external impedances and that tests another circuit.
Figure 11B:
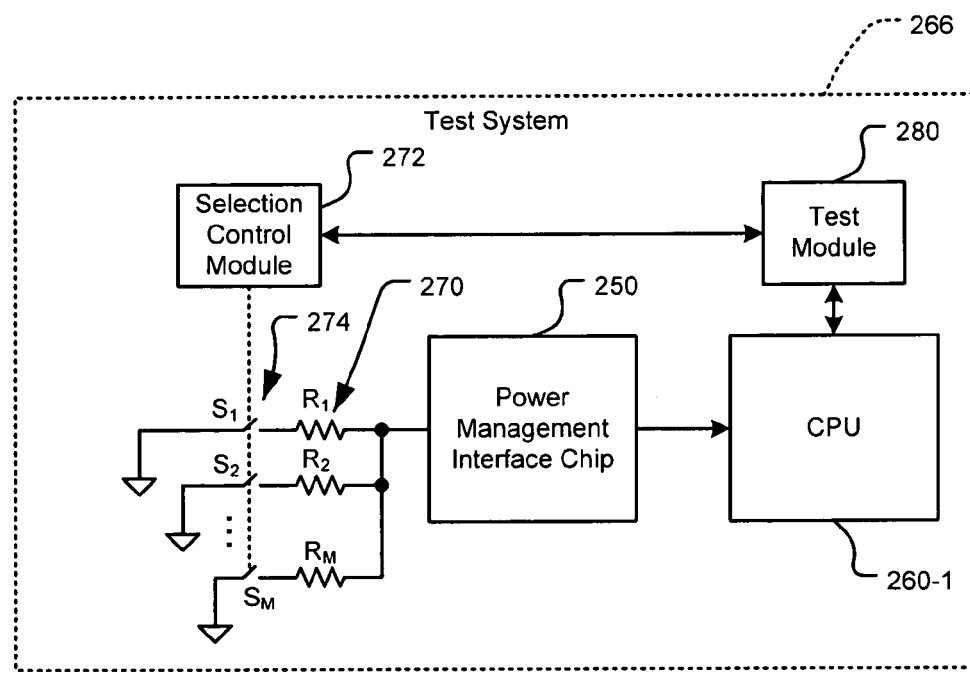
Figure 11C:
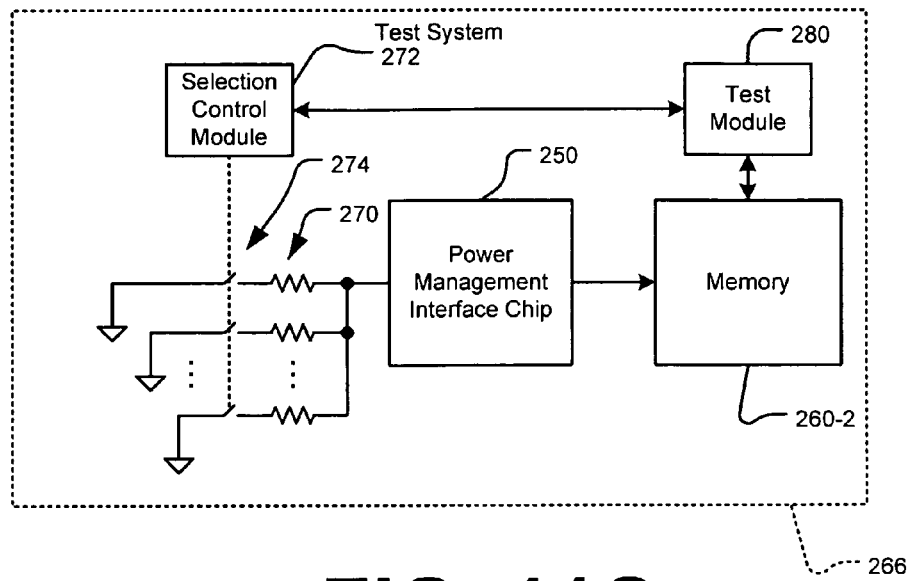

In FIG. 11A, the PMIC 250 is used to test another circuit 260. The circuit 260 may be any type of circuit. For example, the circuit 260 may include an integrated circuit and/or a discrete circuit. In FIG. 11B, the circuit 260 may include a central processing unit (CPU) 260-1. In FIG. 11C, the circuit 260 may include a memory chip 260-2 such as DRAM or other type of memory. Still other types of circuits are contemplated.

The PMIC 250 and the circuit 260 may be attached to a test system 266 such as a printed circuit board (PCB). One or more external impedances 270 such as resistances $R_1, R_2 \ldots R_M$ may be selectively connected to the PMIC 250. Other types of external impedances may be used. A selection control module 272 may be used to selectively connect the external impedances to the PMIC 250 to adjust the output characteristic of the PMIC 250. The selection control module 272 may actuate one or more switches $S_1, S_2 \ldots S_M$, which are generally identified at 274. While the impedances are shown connected to ground, a voltage supply may be used to supply a reference voltage the impedances.

In use, the external impedance value is determined and connected to the PMIC 250 to configure the output characteristic of the PMIC 250. For example, the output characteristic of the PMIC may include a current or voltage output value, a frequency output value, a digital output value and/or any other output characteristic. The selection control module

TABLE IV

| | | | Imped 240 | | | | | | | | | |
|---|---|---|---|---|---|---|---|---|---|---|---|---|
| | | | Short to Vss up to 10k | 19.6k | 28.5k | 40k | 56k | 80.6k | 113k | 160k | 226k | 400k to an open |
| Imped 220 | Nominal Vout | | | | | | Offset % | | | | | |
| | | | 0 | −2 | −4 | −6 | −8 | +2 | +4 | +6 | +8 | |
| Short to Vss up to 10k | 0 or power down | 0 or power down | 0 or power down | 0 or power down | 0 or power down | 0 or power down | 0 or power down | 0 or power down | 0 or power down | 0 or power down | 0 or power down | 0 or power down |
| 19.6k | 0.8 | 0.8 | * | 0.784 | 0.768 | 0.752 | 0.736 | 0.816 | 0.832 | 0.848 | .0864 | 0.8 |
| 28.5k | 1.0 | 1.0 | * | 0.980 | 0.960 | 0.940 | 0.920 | 1.020 | 1.040 | 1.060 | 1.080 | 1.0 |
| 40k | 1.2 | 1.2 | * | 1.176 | 1.152 | 1.128 | 1.104 | 1.224 | 1.248 | 1.272 | 1.296 | 1.2 |
| 56k | 1.5 | 1.5 | * | 1.470 | 1.440 | 1.410 | 1.380 | 1.530 | 1.560 | 1.590 | 1.620 | 1.5 |
| 80.6k | 1.8 | 1.8 | * | 1.764 | 1.728 | 1.692 | 1.656 | 1.836 | 1.872 | 1.908 | 1.944 | 1.8 |
| 113k | 2.5 | 2.5 | * | 2.450 | 2.400 | 2.350 | 2.300 | 2.550 | 2.600 | 2.650 | 2.700 | 2.5 |
| 160k | 3.0 | 3.0 | * | 2.940 | 2.880 | 2.820 | 2.760 | 3.060 | 3.120 | 3.180 | 3.240 | 3.0 |
| 226k | 3.3 | 3.3 | * | 3.234 | 3.168 | 3.102 | 3.036 | 3.366 | 3.432 | 3.498 | 3.564 | 3.3 |
| 400k to an open | 0 or low voltage | 0 or low voltage | 0 or low voltage | 0 or low voltage | 0 or low voltage | 0 or low voltage | 0 or low voltage | 0 or low voltage | 0 or low voltage | 0 or low voltage | 0 or low voltage | 0 or low voltage |

* predefined operation

Table IV above is an example of the nominal Vout and the offset percentage selected in accordance with external impedances. For example if impedance 220 is nominally 160 k ohms the nominal Vout is 3.0 volts and if impedance 240 is 28.5 k the offset from the nominal Vout is −4%. This results in a Vout of the voltage regulator of 3.168 volts.

Figure 10C:
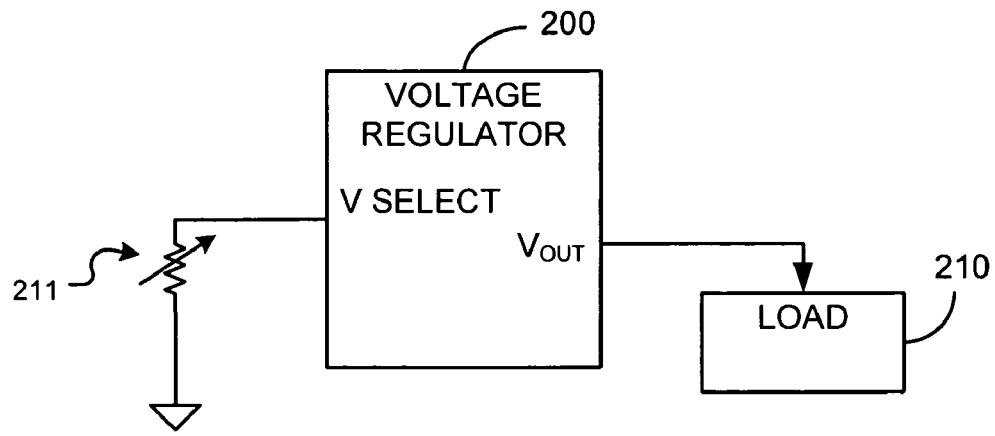
FIG. 10C is a block diagram of a voltage regulator connected to an external impedance.
Figure 10D:
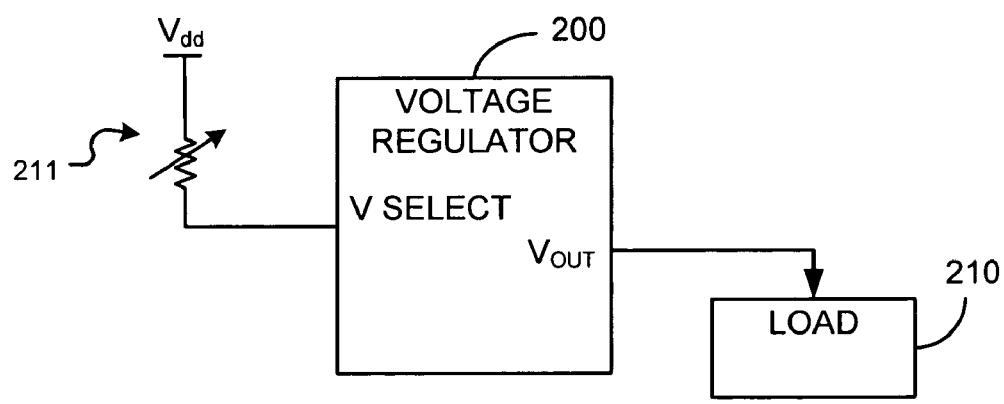
FIG. 10D is a block diagram of a voltage regulator connected to two external impedances.

FIGS. 10C and 10D show variable resistances 211 connected between ground or a voltage reference and a select input of the voltage regulator 200.

Referring now to FIGS. 11A-11C, an integrated circuit 250 such as a power management interface chip (PMIC) is externally configured using an external impedance as described above. While the following discussion relates to a PMIC, the foregoing description applies to any type of integrated circuit.

272 may be used to configure the switches 274 that selectively connect one or more of the external components to the PMIC 250.

The PMIC 250 employs the method described herein to configure the output characteristic of the PMIC 250. The circuit 260 receives the output characteristic. Operation of the circuit 260 is tested at the selected output characteristic to determine whether the circuit meets the operating requirements of the circuit. One or more test modules 280 may be provided to receive outputs of the circuit 260 to test various aspects of the operation of the circuit 260. Alternately, the circuit 260 may have self-testing abilities via an internal test module.

The test modules 280 compare one or more operational parameters of the circuit 260 to predetermined operational parameters for each of the output characteristics selected by the selection control module 272. As a result, the circuit 260 can be fully tested over various operating conditions. Furthermore, a range of operation of the circuit 260 can be determined by varying the output characteristics and determining whether or not the circuit 260 operates within specification. As can be appreciated, the test module 280, the selection control module 272 and/or the switches 274 may be combined into an integrated circuit.

For example, the circuit 260 may be designed to operate at a particular operating voltage +/− a predetermined tolerance such as 4V+/−0.5V. The output characteristic of the PMIC 250 can be set equal to 3.50V, 3.55V, 3.60V, . . . , and 4.5V and the operation of the circuit 260 can be tested at each voltage level.

Figure 12:
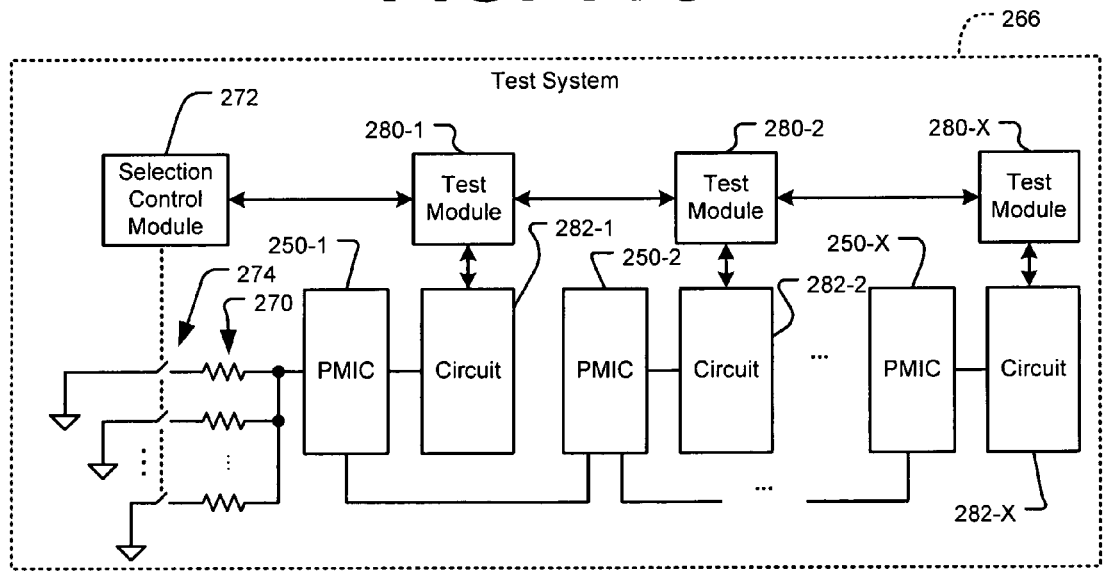
FIG. 12 illustrates the PMIC of FIGS. 11A-11C configured in a daisy-chain for testing multiple circuits or ICs.

Referring now to FIG. 12, multiple PMICs of FIGS. 11A-11C can configured in a daisy-chain for testing multiple circuits. More particularly, the test system 266 may include pairs of PMICs 250-1, 250-2, . . . , and 250-X and circuits 282-1, 282-2, . . . , and 282-X, respectively, where X is an integer greater than one. The first PMIC 250-1 is selectively connected to one or more of the external components 270. Additional PMICs 250-2, . . . 250-X communicate in a daisy-chain fashion with a preceding PMIC and/or with the first PMIC.

The additional PMICs may receive an analog signal corresponding to the measured external impedance, a digital signal corresponding to the digital value, a digital value corresponding to the selected address, a digital value corresponding to the address contents, a value corresponding to a function of the address contents and/or any other signal indicating the selected output characteristic. Corresponding test modules 280-1, 280-2, . . . , and 280-X may be provided to test operation of the circuits 282-1, 282-2, . . . , and 282-X, respectively. Alternately, a single multi-port test module (not shown) may be provided to test operation of multiple circuits 282. The test module(s) and/or selection module(s) may also be integrated with the PMICs 250.

Figure 13A:
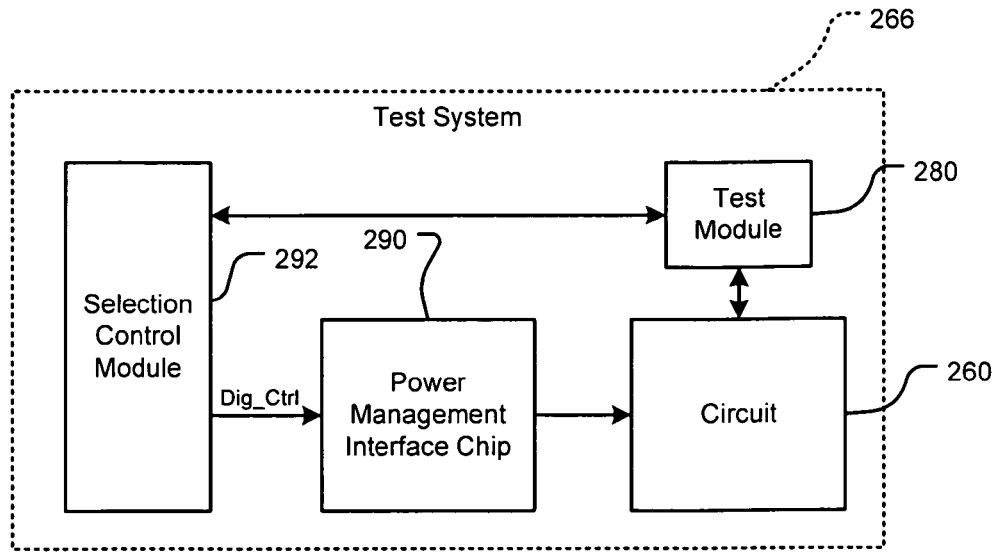
FIG. 13A-13C are functional block diagrams of a power management interface chip (PMIC) that is externally configured and that tests another circuit.
Figure 13B:
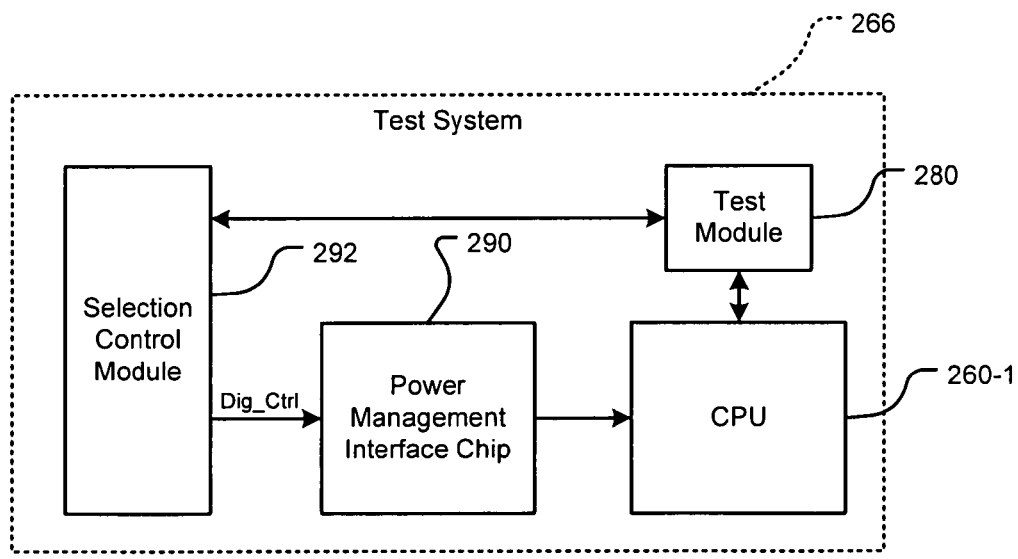
Figure 13C:
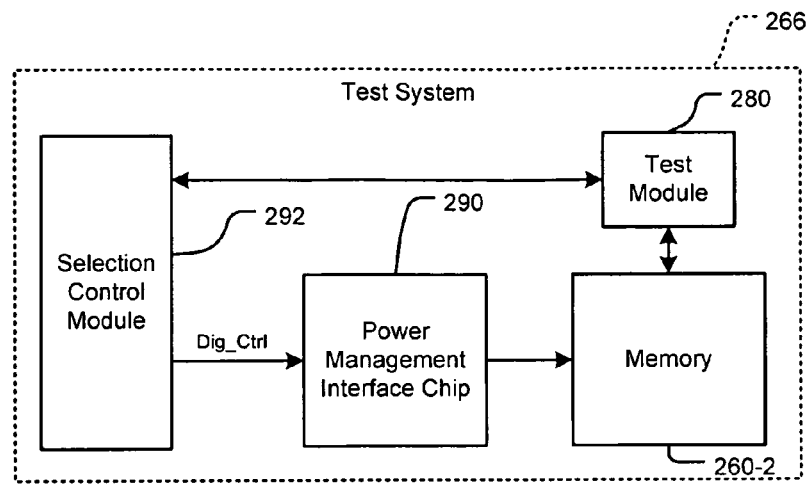

Referring now to FIG. 13A-13C, a power management interface chip (PMIC) 290 is externally configured by another selection control module 292. The PMIC 290 may have a default value for the external characteristic. The selection control module 292 alters the default value using a digital signal via a single pin and/or separate higher and lower signals via two pins. The signals can be analog as well. The PMIC 290 is configured by the input signals to provide different output characteristics. Otherwise operation of the circuit is similar to that shown above.

In use, the selection control module 292 generates digital signals for the PMIC 290 to configure the output characteristic of the PMIC 290. For example, the output characteristic of the PMIC 290 may include a current or voltage output value, a frequency output value, a digital output value and/or any other output characteristic. The circuit 260 receives the output characteristic of the PMIC 290. Operation of the circuit 260 is tested at the selected output characteristic to determine whether the circuit meets the operating requirements of the circuit.

One or more test modules 280 may be provided to receive outputs of the circuit 260 to test various aspects of the operation of the circuit 260. Alternately, the test modules may be integrated with the PMIC. Alternately, the circuit 260 may have self-testing abilities via an internal test module.

The test modules 280 compare one or more operational parameters of the circuit 260 to predetermined operational parameters for each of the output characteristics selected by the selection control module 292. As a result, the circuit 260 can be fully tested over various operating conditions. Furthermore, a range of operation of the circuit 260 can be determined by varying the output characteristics and determining whether or not the circuit 260 operates within specification. As can be appreciated, the test module 280, the selection control module 292 may be combined into an integrated circuit.

Figure 14:
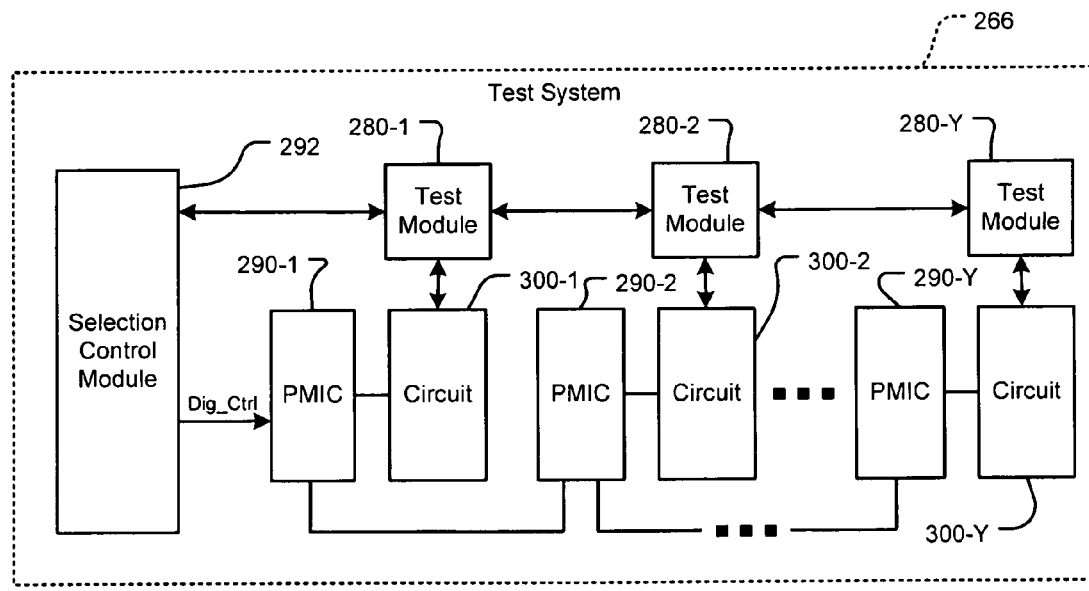
FIG. 14 illustrates the PMIC of FIGS. 13A-13C configured in a daisy-chain for testing multiple circuits or ICs.

Referring now to FIG. 14, the PMIC of FIGS. 13A-13C can be configured in a daisy-chain for testing multiple circuits. More particularly, the test system 266 may include pairs of PMICs 290-1, 290-2, . . . , and 290-Y and circuits 300-1, 300-2, . . . , and 300-Y, respectively, where Y is an integer greater than one. The first PMIC 290-1 is selectively configured by the selection control module 292. Additional PMICs 290-2, . . . 290-X communicate in a daisy-chain fashion with a preceding PMIC. Alternately, the PMICs 290-2, . . . 290-X can communicate directly with the selection control module 292.

Corresponding test modules 280-1, 280-2, . . . , and 280-X may be provided to test operation of the circuits 300-1, 300-2, . . . , and 300-X, respectively. Alternately, a multi-port test module may be provided to test operation of multiple circuits 300. The test module(s) and/or selection control module(s) may also be integrated with the PMICs 250.

Figure 15:
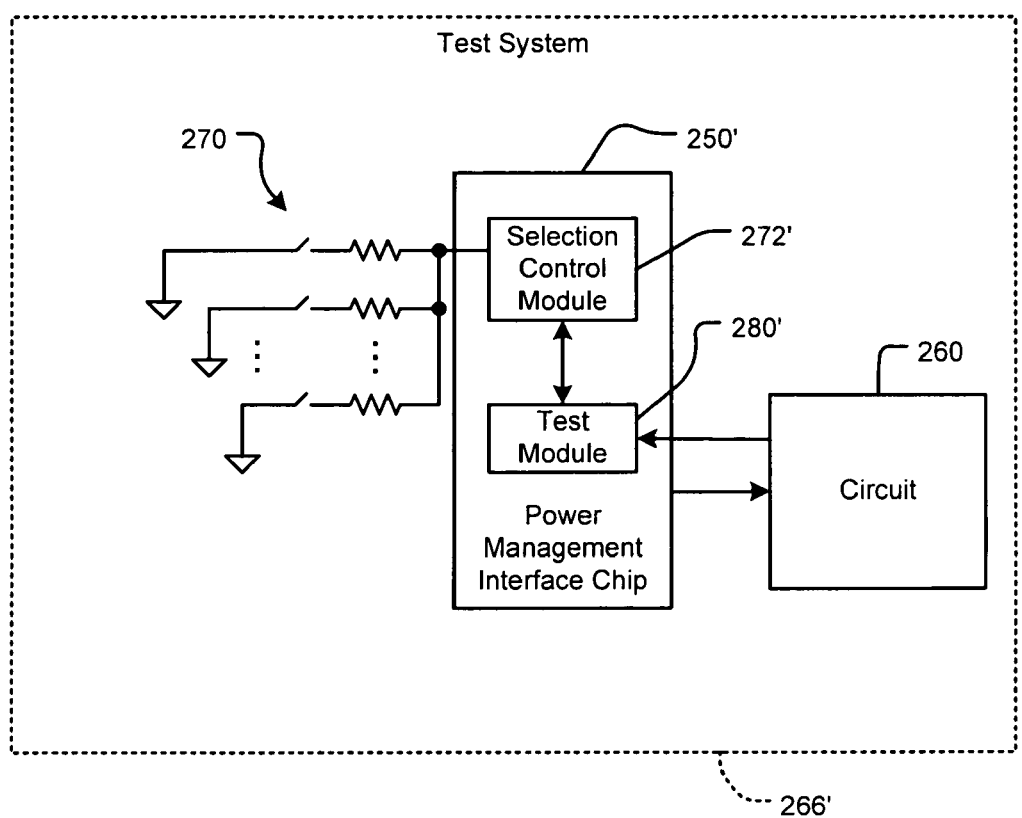
FIG. 15 shows a test module integrated with a PMIC.

Referring now to FIG. 15, a test system 266' includes an integrated circuit 250' such as a PMIC that is externally configured using an external impedance as described above. While the following discussion relates to a PMIC, the foregoing description applies to any type of integrated circuit. The PMIC 250' may include a test module 280' for testing one or more outputs of the circuit 260. One or more external impedances 270 such as resistances $R_1, R_2 \ldots R_M$ may be connected to the PMIC 250'. Other types of external impedances may be used. A selection control module 272' associated with the PMIC 250' may be used to connect one or more of the external impedances to the PMIC 250', sequentially connect the external impedances and/or combine the external impedances to adjust the output characteristic of the PMIC 250'. The selection control module 272' may include one or more switches. While the impedances are shown connected to a reference potential such as ground, a voltage supply may be used to supply a reference voltage to the impedances.

In use, one or more external impedances are connected to the PMIC 250' to configure the output characteristic of the PMIC 250'. For example, the output characteristic of the PMIC may include a current or voltage output value, a frequency output value, a digital output value and/or any other output characteristic. The selection control module 272' may be used to sequentially connect and/or combine one or more of the impedances to the PMIC 250'. The selection control module 272' and/or the test module may be omitted from the PMIC 250'.

Figure 16:
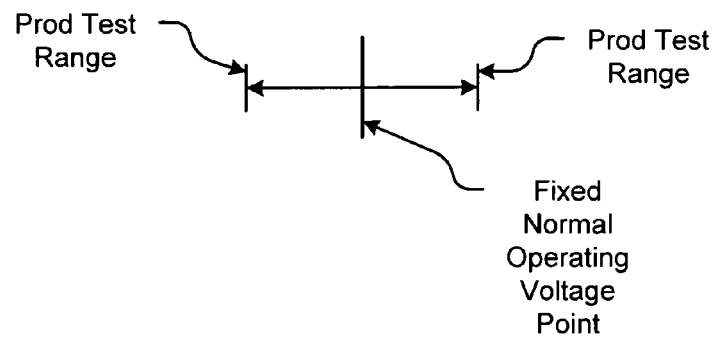
FIGS. 16 and 17 illustrate varying voltage supply levels from a fixed value or range for a circuit during production testing.
Figure 17:
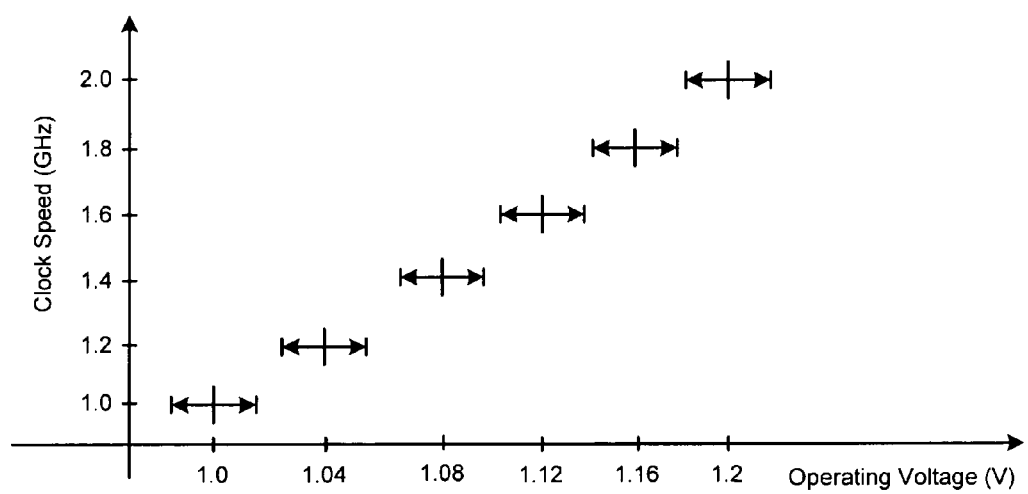

Referring now to FIGS. 16 and 17, an output characteristic supplied by the PMIC or other circuit to a circuit under test can be varied during production testing. While the foregoing examples may be described in the context of voltage levels, the foregoing description applies to any output characteristic such as but not limited to current, resistance, impedance, frequency, etc. For a circuit that operates using a fixed voltage setpoint or value during normal operation, the test voltage may be varied using a range having values above and below the fixed voltage value. For a circuit that operates using a voltage range during normal operation, an extended voltage range can be used that includes values above and below the variable voltage range used during normal operation.

In FIG. 17, the clock signal supplied to the circuit under test can also be varied in conjunction with the test voltage. In other words, the voltage range can be adjusted and different operating voltage ranges can be tested. For example, a circuit may be tested at 1.0V+/−5% at 1.0 Ghz, 1.04V+/−5% at 1.2 Ghz, 1.08V+/−5% at 1.4 Ghz, 1.12V+/−5% at 1.6 Ghz, 1.16V+/−5% at 1.8 Ghz, and 1.2V+/−5% at 2 GHz as shown in FIG. 17. The voltage range may be varied for each operating voltage range and/or fixed values and/or percentages can be used.

Figure 18:
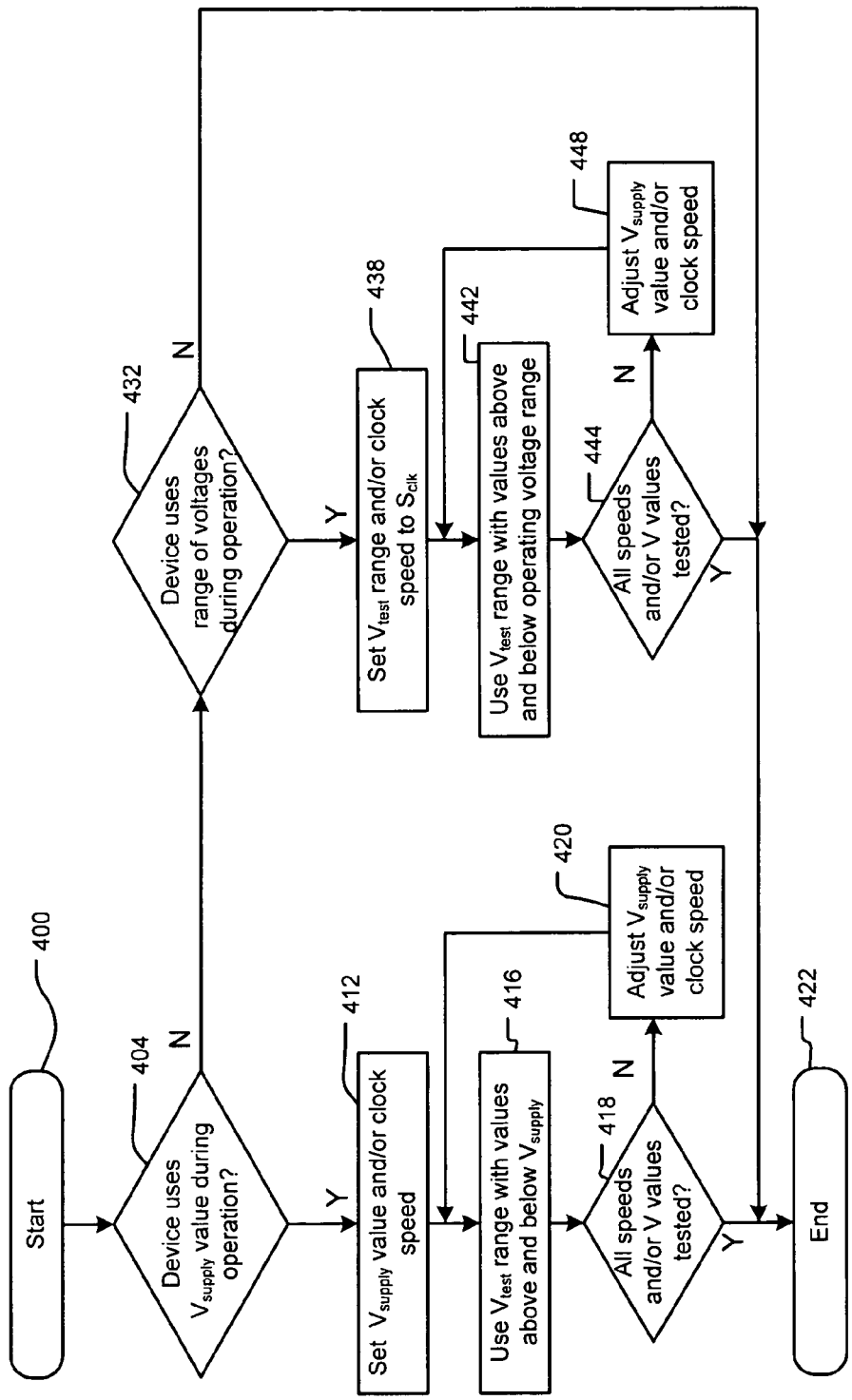
FIG. 18 is a flowchart illustrating a method for production testing a circuit.

Referring now FIG. 18, a flowchart illustrating a method for production testing a circuit is shown. Control begins in step 400. In step 404, control determines whether the device uses fixed voltage setpoints or values during operation. Control sets a clock speed to a first clock speed and/or the voltage to one of the fixed voltage values in step 412. In step 416, control uses a voltage test range with values above and below the current fixed voltage value. In step 418, control determines whether all of the clock speeds and/or voltage setpoints have been tested. If step 418 is false, control adjusts the clock speed and/or the fixed voltage value in step 420 and control returns to step 416. If step 418 is true, control ends in step 422.

If step 404 is false, control determines whether to the device uses one or more ranges of voltages during normal operation in step 432. If not, control ends in step 422. Control sets a clock speed to a first clock speed and a voltage range to an extended voltage range based on a first operating voltage range in step 438. In step 442, control uses the current extended voltage range with values above and below the operating voltage range. In step 444, control determines whether all clock speeds and/or operating voltage ranges have been tested. If step 444 is false, control adjusts the clock speed and/or extended voltage operating range to new values in step 448 and control returns to step 442. If step 444 is true, control ends in step 422.

Figure 19:
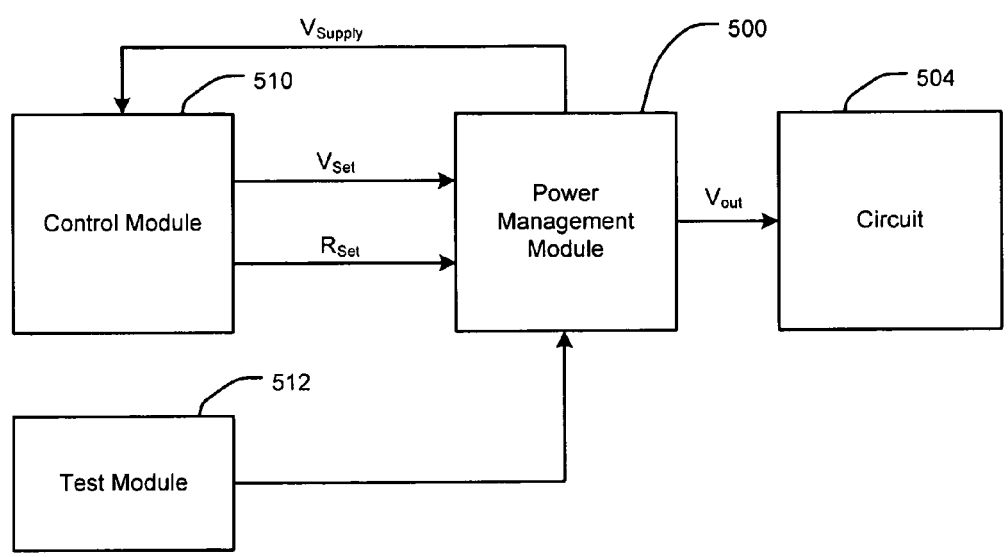
FIG. 19 is a functional block diagram of a power management module that production tests another circuit.

Referring now to FIG. 19, a functional block diagram of an exemplary power management module 500 such as a PMIC that production tests another circuit 504 is shown. While the foregoing example may be described in the context of voltage, the foregoing description applies to any output characteristic such as but not limited to current, resistance, impedance, frequency, etc. A control module 510 generates a voltage setpoint that may be equal to an operating voltage value and/or a test voltage value and a setpoint range value that sets a range based on the voltage setpoint value. The range may be set as a percentage, fixed offsets above and/or below and/or using other criteria. The power management module 500 may output a supply voltage to the control module 510. A test module 512 may output test data to the power management module 500 and/or to the circuit 504. The test module 512 may use serial and/or parallel signaling. Two or more of the control module 510, the test module 512 and/or the power management module 500 may be integrated by a single integrated circuit.

A number of embodiments of the invention have been described. Nevertheless, it will be understood that various modifications may be made without departing from the spirit and scope of the invention. Accordingly, other embodiments are within the scope of the following claims.

What is claimed:

1. A production testing system for testing an integrated circuit comprising:
a control module that generates a setpoint and a value indicative of a predetermined setpoint range;
a configurable integrated circuit that receives said setpoint and said value, that has M predetermined configurations, and that generates N successive output signals by sequentially selecting N ones of M discrete values of an output characteristic of said configurable integrated circuit based on said setpoint and said value, where M and N are integers greater than one and where M is greater than N; and
an integrated circuit that is tested in accordance with said N output signals of said configurable integrated circuit.

2. The production testing system of claim 1 wherein said integrated circuit includes at least one of a memory circuit and a central processing unit.

3. The production testing system of claim 1 further comprising a test module that tests operation of said integrated circuit while said integrated circuit operates based on said N output signals of said configurable integrated circuit.

4. The production testing system of claim 3 wherein said test module is integrated with at least one of said control module, said configurable integrated circuit and said integrated circuit.

5. The production testing system of claim 3 wherein said test module communicates with one of said integrated circuit and said configurable integrated circuit.

6. The production testing system of claim 1 further comprising a clock that generates a plurality of clock frequencies for said integrated circuit.

7. A production testing system for testing an integrated circuit comprising:
a control module that generates a setpoint and a setpoint range;
a configurable integrated circuit that receives said setpoint and said setpoint range, that has M predetermined configurations, and that generates N successive output signals by seguentially selecting N ones of M discrete values of an output characteristic of said configurable integrated circuit based on said setpoint and said setpoint range, where M and N are integers greater than one and where M is greater than N;
an integrated circuit that is tested in accordance with said N output signals of said configurable integrated circuit; and
a clock that generates a plurality of clock frequencies for said integrated circuit,
wherein said integrated circuit is tested at a first clock speed, a first setpoint and a first setpoint range and a second clock speed that is different that said first clock speed, a second setpoint that is different than said first setpoint and a second setpoint range.

8. The production testing system of claim 1 wherein said first setpoint range is different that said second setpoint range.

9. The production testing system of claim 1 wherein said setpoint range includes a fixed offset from said setpoint and a percentage offset from said setpoint.

10. The production testing system of claim 1 wherein said setpoint is a voltage setpoint, said setpoint range is a voltage setpoint range and said N output signals are N voltage output signals.

11. A method for production testing an integrated circuit comprising:
generating a setpoint and a value indicative of a predetermined setpoint range using a control module;
providing a configurable integrated circuit that receives said setpoint and said value, that has M predetermined configurations, and that generates N successive output signals by sequentially selecting N ones of M discrete values of an output characteristic of said configurable integrated circuit based on said setpoint and said value, where M and N are integers greater than one and where M is greater than N; and
testing an integrated circuit in accordance with said N output signals of said configurable integrated circuit.

12. The method of claim 11 wherein said integrated circuit includes at least one of a memory circuit and a central processing unit.

13. The method of claim 11 further comprising testing operation of said integrated circuit while said integrated circuit operates based on said N output signals of said configurable integrated circuit.

14. The method of claim 13 further comprising performing said testing using a test module that is integrated with at least one of said control module, said configurable integrated circuit and said integrated circuit.

15. The method of claim 13 further comprising performing said testing using a test module that communicates with one of said integrated circuit and said configurable integrated circuit.

16. The method of claim 11 further comprising generating a plurality of clock frequencies for said integrated circuit.

17. A method for production testing an integrated circuit comprising:
  generating a setpoint and a setpoint range using a control module;
  providing a configurable integrated circuit that receives said setpoint and said setpoint range, that has M predetermined configurations, and that generates N successive output signals by sequentially selecting N ones of M discrete values of an output characteristic of said configurable integrated circuit based on said setpoint and said setpoint range, where M and N are integers greater than one and where M is greater than N;
  testing an integrated circuit in accordance with said N output signals of said configurable integrated circuit;
  generating a plurality of clock frequencies for said integrated circuit;
  testing said integrated circuit at a first clock speed, a first setpoint and a first setpoint range; and
  testing said integrated circuit at a second clock speed that is different that said first clock speed, a second setpoint that is different than said first setpoint and a second setpoint range.

18. The method of claim 11 wherein said first setpoint range is different that said second setpoint range.

19. The method of claim 11 wherein said setpoint range includes a fixed offset from said setpoint and a percentage offset from said setpoint.

20. The method of claim 11 wherein said setpoint is a voltage setpoint, said setpoint range is a voltage setpoint range and said N output signals are N voltage output signals.

21. A production testing system for testing an integrated circuit comprising:
  control means for generating a setpoint and a value indicative of a predetermined setpoint range;
  a configurable integrated circuit that receives said setpoint and said value, that has M predetermined configurations, and that generates N successive output signals by sequentially selecting N ones of M discrete values of an output characteristic of said configurable integrated circuit based on said setpoint and said value, where M and N are integers greater than one and where M is greater than N; and
  an integrated circuit that is tested in accordance with said N output signals of said configurable integrated circuit.

22. The production testing system of claim 21 wherein said integrated circuit includes at least one of a memory circuit and a central processing unit.

23. The production testing system of claim 21 further comprising test means for testing operation of said integrated circuit while said integrated circuit operates based on said N output signals of said configurable integrated circuit.

24. The production testing system of claim 23 wherein said test means is integrated with at least one of said control means, said configurable integrated circuit and said integrated circuit.

25. The production testing system of claim 23 wherein said test means communicates with one of said integrated circuit and said configurable integrated circuit.

26. The production testing system of claim 21 further comprising clock means for generating a plurality of clock frequencies for said integrated circuit.

27. A production testing system for testing an integrated circuit comprising:
  control means for generating a setpoint and a setpoint range;
  a configurable integrated circuit that receives said setpoint and said setpoint range, that has M predetermined configurations, and that generates N successive output signals by sequentially selecting N ones of M discrete values of an output characteristic of said configurable integrated circuit based on said setpoint and said setpoint range, where M and N are integers greater than one and where M is greater than N;
  an integrated circuit that is tested in accordance with said N output signals of said configurable integrated circuit; and clock means for generating a plurality of clock frequencies for said integrated circuit,
    wherein said integrated circuit is tested at a first clock speed, a first setpoint and a first setpoint range and a second clock speed that is different that said first clock speed, a second setpoint that is different than said first setpoint and a second setpoint range.

28. The production testing system of claim 21 wherein said first setpoint range is different that said second setpoint range.

29. The production testing system of claim 21 wherein said setpoint range includes one of a fixed offset from said setpoint and a percentage offset from said setpoint.

30. The production testing system of claim 21 wherein said setpoint is a voltage setpoint, said setpoint range is a voltage setpoint range and said N output signals are N voltage output signals.

* * * * *

UNITED STATES PATENT AND TRADEMARK OFFICE
CERTIFICATE OF CORRECTION

PATENT NO. : 7,516,027 B2
APPLICATION NO. : 11/546832
DATED : April 7, 2009
INVENTOR(S) : Sehat Sutardja It is certified that error appears in the above-identified patent and that said Letters Patent is hereby corrected as shown below:

| | |
|---|---|
| Column 1, Line 45 | Delete "be" after "may" |
| Column 5, Line 48 | Delete "that" and insert -- than -- |
| Column 5, Line 51 | Delete "that" and insert -- than -- |
| Column 6, Line 16 | Delete "that" and insert -- than -- |
| Column 6, Line 18 | Delete "that" and insert -- than -- |
| Column 6, Line 47 | Delete "that" and insert -- than -- |
| Column 6, Line 49 | Delete "that" and insert -- than -- |
| Column 9, Line 58 | Delete "in" after "separated" |
| Column 10, Line 16 | Delete "in" after "separated" |
| Column 13-14, Line 40 | In Table IV, delete ".0864" and insert -- 0.864 -- |
| Column 14, Line 19 | Insert -- to -- after "voltage" |
| Column 15, Line 16 | Insert -- be -- after "can" |
| Column 17, Line 19 | Delete "to" after "whether" |
| Column 18, Line 42 | Delete "that" and insert -- than -- |
| Column 18, Line 46 | Delete "that" and insert -- than -- |
| Column 19, Line 37 | Delete "that" and insert -- than -- |

UNITED STATES PATENT AND TRADEMARK OFFICE
CERTIFICATE OF CORRECTION

PATENT NO.        : 7,516,027 B2
APPLICATION NO.   : 11/546832
DATED             : April 7, 2009
INVENTOR(S)       : Sehat Sutardja It is certified that error appears in the above-identified patent and that said Letters Patent is hereby corrected as shown below:

| | |
|---|---|
| Column 19, Line 41 | Delete "that" and insert -- than -- |
| Column 20, Line 42 | Delete "that" and insert -- than -- |
| Column 20, Line 46 | Delete "that" and insert -- than -- |

Signed and Sealed this

Twenty-sixth Day of May, 2009

JOHN DOLL
*Acting Director of the United States Patent and Trademark Office*